United States Patent
Kamei et al.

(10) Patent No.: US 8,743,618 B1
(45) Date of Patent: Jun. 3, 2014

(54) BIT LINE RESISTANCE COMPENSATION

(71) Applicant: Sandisk Technologies, Inc., Plano, TX (US)

(72) Inventors: Teruhiko Kamei, Yokohama (JP); Seungpil Lee, San Ramon, CA (US); Siu Lung Chan, San Jose, CA (US); Kwang Ho Kim, Pleasanton, CA (US); Man Lung Mui, Santa Clara, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/755,894

(22) Filed: Jan. 31, 2013

Related U.S. Application Data

(60) Provisional application No. 61/726,756, filed on Nov. 15, 2012.

(51) Int. Cl.
*G11C 16/06* (2006.01)
*G11C 16/04* (2006.01)
*G11C 7/22* (2006.01)
*G11C 16/26* (2006.01)

(52) U.S. Cl.
CPC ............ *G11C 16/26* (2013.01); *G11C 16/0483* (2013.01)
USPC ............. 365/185.21; 365/185.18; 365/189.15

(58) Field of Classification Search
CPC ............................ G11C 16/26; G11C 16/0483
USPC ..................................................... 365/185.21
See application file for complete search history.

(56) References Cited

U.S. PATENT DOCUMENTS

| | | | |
|---|---|---|---|
| 7,551,477 B2 | 6/2009 | Mokhlesi | |
| 7,590,002 B2 | 9/2009 | Mokhlesi | |
| 7,596,035 B2 | 9/2009 | Doyle | |
| 7,751,250 B2 * | 7/2010 | Lee et al. ................ | 365/185.21 |
| 8,194,472 B2 | 6/2012 | Sato | |

OTHER PUBLICATIONS

U.S. Appl. No. 13/755,905, filed Jan. 31, 2013.

* cited by examiner

*Primary Examiner* — Son Mai
(74) *Attorney, Agent, or Firm* — Vierra Magen Marcus LLP

(57) ABSTRACT

Methods for compensating for variations in bit line resistance during sensing of memory cells are described. The variations in bit line resistance may occur die-to-die or plane-to-plane on the same die. In some embodiments, for each die or memory plane on a die, a plurality of bit line read voltages associated with a plurality of zones may be determined based on sensing criteria. The sensing criteria may comprise a number of fail bits. Each zone of the plurality of zones may be associated with a memory array region within a die or memory plane. Prior to performing a read or verify operation on a group of memory cells, a bit line read voltage used during sensing of the group of memory cells may be determined based on the plurality of bit line read voltages and a zone associated with the group of memory cells.

28 Claims, 21 Drawing Sheets

(Prior Art)

BIT LINE RESISTANCE COMPENSATION

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In recent years, NAND flash memory has been scaled in order to reduce cost per bit. However, as process geometries shrink, many design and process challenges are presented. These challenges include increased bit line resistance and increased variability in bit line resistance between bit lines on the same memory die.

DETAILED DESCRIPTION

Figure 1:
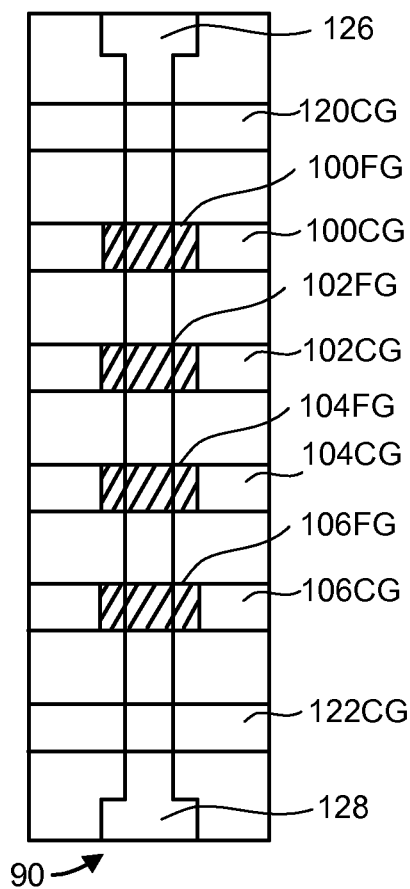
FIG. 1 depicts one embodiment of a NAND string.

Technology is described for compensating for variations in bit line resistance during sensing of memory cells. The variations in bit line resistance may occur die-to-die (e.g., due to manufacturing variations between dies fabricated on the same wafer, on different wafers, or in different lots) or plane-to-plane on the same die. The variations in bit line resistance may be caused by line geometry variations (e.g., variations in line widths and/or thicknesses). In some embodiments, for each die or each memory plane (or memory core) on a die, a plurality of bit line read voltages associated with a plurality of zones may be determined based on sensing criteria and used for compensating for variations in bit line resistance. The sensing criteria may comprise a number of fail bits. Each zone of the plurality of zones may be associated with a memory array region within a die or memory plane. Prior to performing a read or verify operation on a group of memory cells, a bit line read voltage for use during sensing of the group of memory cells may be determined based on the plurality of bit line read voltages and a zone associated with the group of memory cells. In some cases, the bit line read voltage may be interpolated from the plurality of bit line read voltages.

In some embodiments, within each zone, different bit line voltages may be applied to different bit line groupings in order to compensate for systematic process variations (e.g., systematic variations in bit line resistance between neighboring bit lines due to the use of multiple patterning lithography techniques such as spacer-based double patterning or quadruple spacer patterning). Each bit line grouping may be identified based on one or more bit line addresses or one or more column addresses. In one example, a first bit line grouping may be associated with a grouping of even bit lines (e.g., bit line 0, bit line 2, bit line 4, etc.) and a second bit line grouping may be associated with a grouping of odd bit lines (e.g., bit line 1, bit line 3, bit line 5, etc.). In another example, a first grouping of bit lines may correspond with a grouping of bit lines comprising every fourth bit line (e.g., bit line 0, bit line 4, bit line 8, bit line 12, etc.).

For a NAND flash memory, the bit line resistance may correspond with the line resistance between a sense amplifier and a NAND string. The largest bit line resistance and largest variation in bit line resistance may correspond with a NAND string in a block farthest away from the sense amplifier (i.e., a far block). The variations in bit line resistance may come from various sources including wafer level trends and layout pattern dependencies. In one example, wafer level variation in interconnect layer thickness (e.g., due to chemical mechanical polishing variations causing film thickness variations) may lead to variations in interconnect line thicknesses between lines on the same die and/or between lines on different dies associated with the same wafer. In another example, layout pattern dependencies may cause two interconnect lines that are designed identically to actually be fabricated as lines of different widths (e.g., due to optical diffraction and interference, mask or lens distortions in the photolithographic system, or plasma etch microloading effects). Variations in bit line resistance between neighboring bit lines may occur due to the use of multiple patterning lithography techniques for improving bit line density (e.g., spacer-based double patterning or quadruple spacer patterning). One issue with large variations in bit line resistance is that the variations in bit line resistance may cause an increase in the effective threshold voltage distributions of memory cells being sensed. The increase in the effective threshold voltage distribution may be due to variability in the IR voltage drops along bit lines leading to variations in the drain bias voltages applied to various memory cells during sensing. Thus, there is a need to compensate for die-to-die and/or plane-to-plane variations in bit line resistance during sensing of memory cells.

Figure 2:
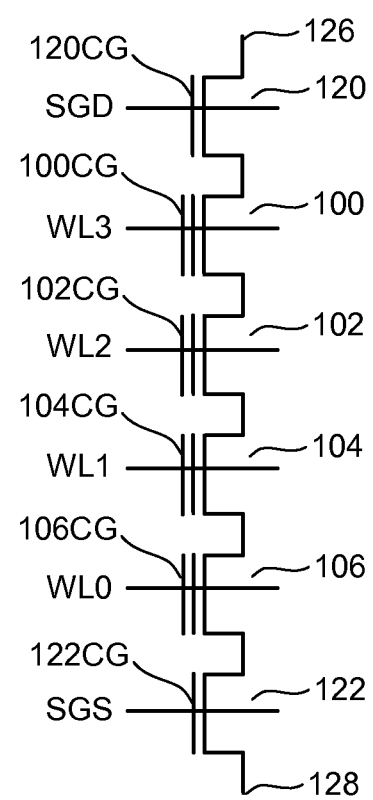
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
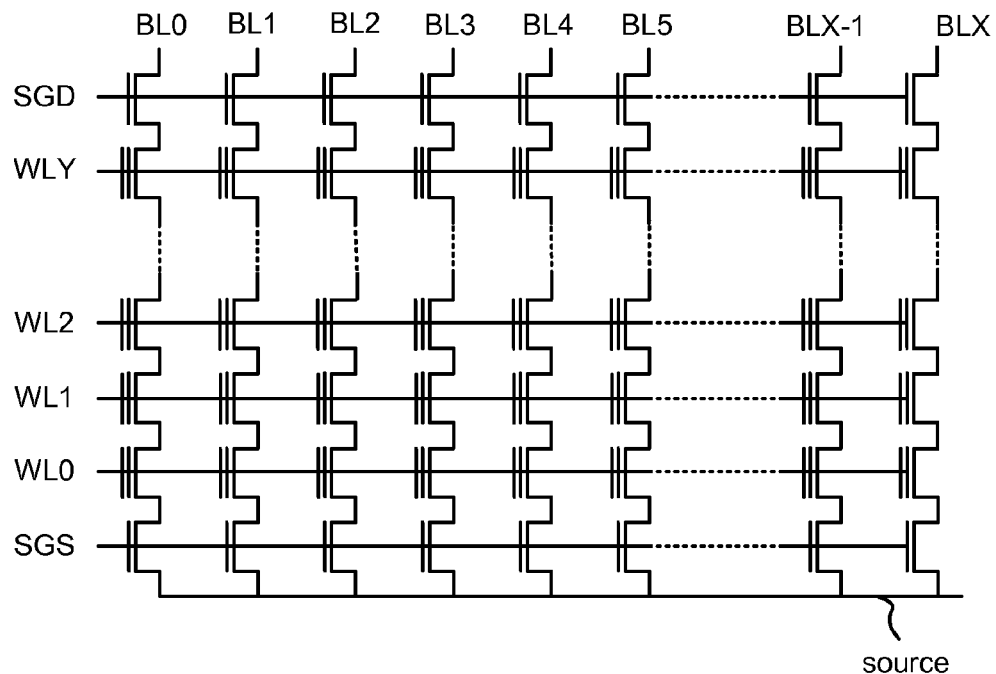
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

One benefit of a shared-bit-line NAND architecture is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage on the bit line may be measured after a period of time to see whether it has been discharged by a particular amount or not.

Figure 3B:
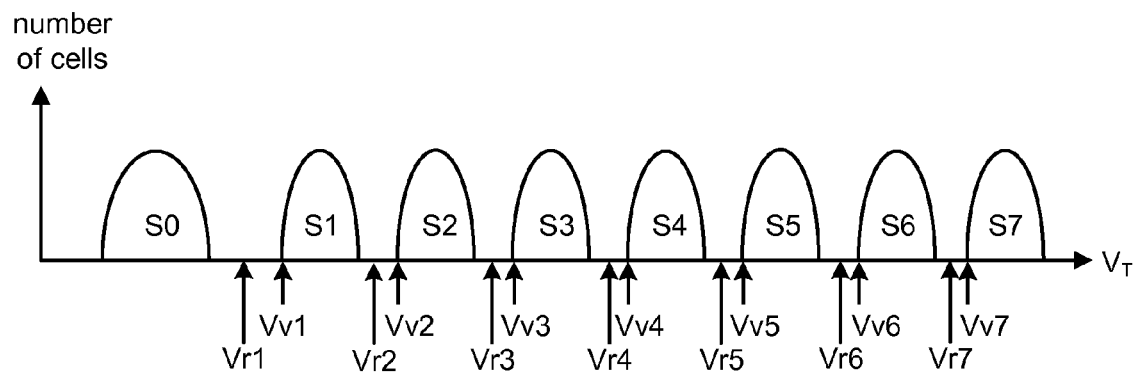
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more or less than three bits of data per memory cell (e.g., such as four or more bits of data per memory cell). At the end of a successful programming process (with verification), the threshold voltages of memory cells within a memory block or plane should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 Volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4A:
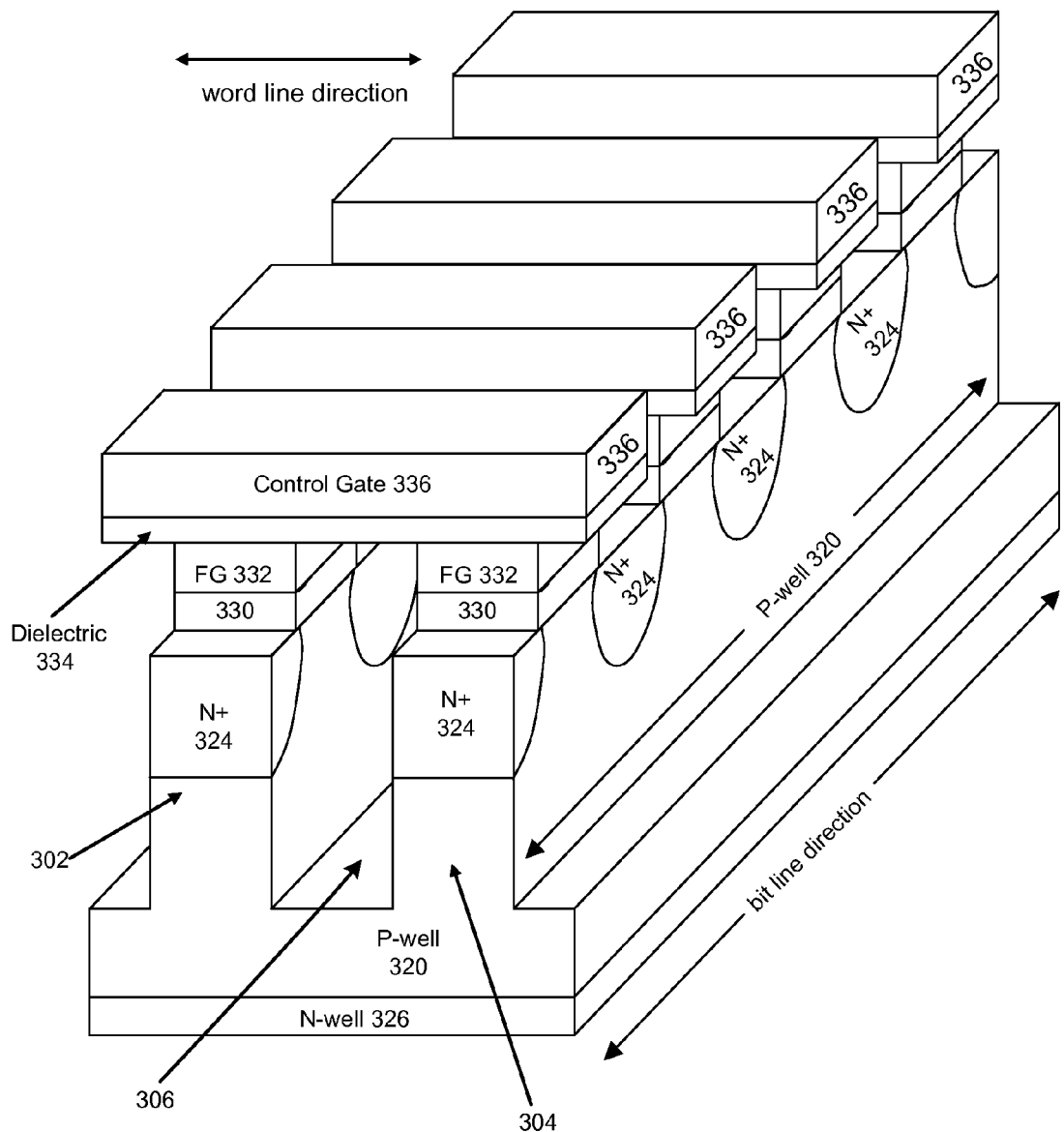
FIG. 4A depicts one embodiment of two NAND strings that may be fabricated as part of a larger flash memory array.

FIG. 4A depicts one embodiment of two NAND strings 302 and 304 that may be fabricated as part of a larger flash memory array. As depicted, NAND strings 302 and 304 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 302 is separated from NAND string 304 by an isolation region 306. The isolation region 306 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

FIGS. 4B-4H depict various embodiments of a process for forming features (e.g., interconnect lines such as bit lines or word lines) using multiple patterning lithography. FIGS. 4B-4H depict various stages of fabrication using cross-sectional views. In one embodiment, multiple patterning lithography techniques (e.g., spacer-based double patterning) may be used to improve feature density (e.g., the density of bit lines and/or word lines).

Figure 4B:
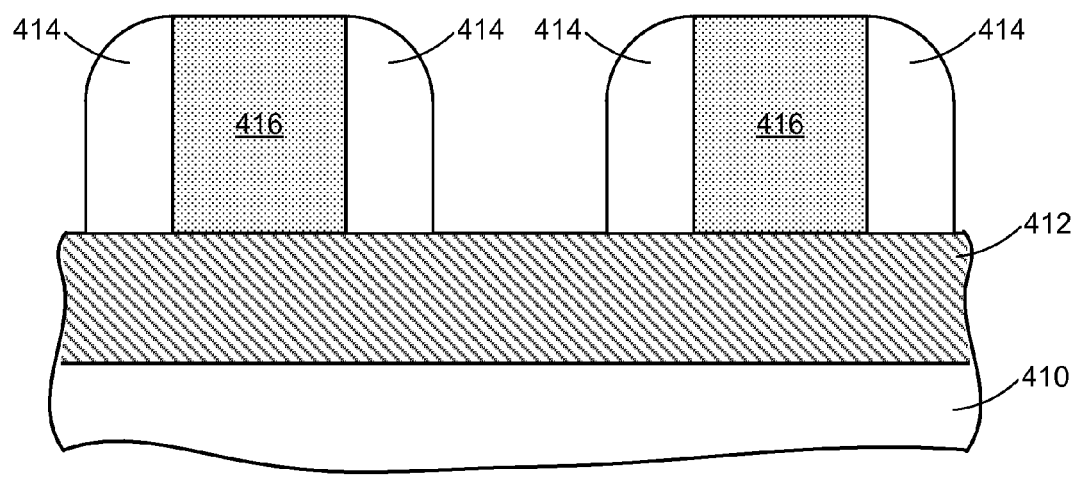
FIGS. 4B-4H depict various embodiments of a process for forming features using multiple patterning lithography.

In FIG. 4B, a second layer 412 is formed on a first layer 410. Cores 416 (or mandrels) may comprise patterned features formed on the second layer 412. The line widths of cores 416 and the line spacings between cores 416 may be set near the optical resolution of a photolithography system. A line width may comprise the width of a line (e.g., the width of a bit line) and a line spacing may comprise the distance between two adjacent lines (e.g., the spacing between two adjacent bit lines). A line pitch may comprise the sum of a line width and a line spacing. Spacers 414 may be formed to the sides of cores 416 (e.g., by conformally depositing a spacer layer and then using an anisotropic etch). In some cases, the spacers 414 may include silicon dioxide or silicon nitride.

In one embodiment, cores 416 are formed by depositing a core layer over the second layer 412, depositing a layer of photoresist (positive or negative) over the core layer, exposing the layer of photoresist to light via a mask (i.e., the mask determines which areas of the layer of photoresist are exposed to the light), and then selectively etching the core layer based on the exposed portions of the layer of photoresist. Various etching techniques such as dry etching, wet chemical etching, plasma etching, or reactive-ion etching (RIE) may be used to form the cores 416 from the core layer. In some cases, the core layer may include amorphous carbon or hydrogenated amorphous carbon. The core layer may also include a polycrystalline silicon film (or polysilicon).

Figure 4C:
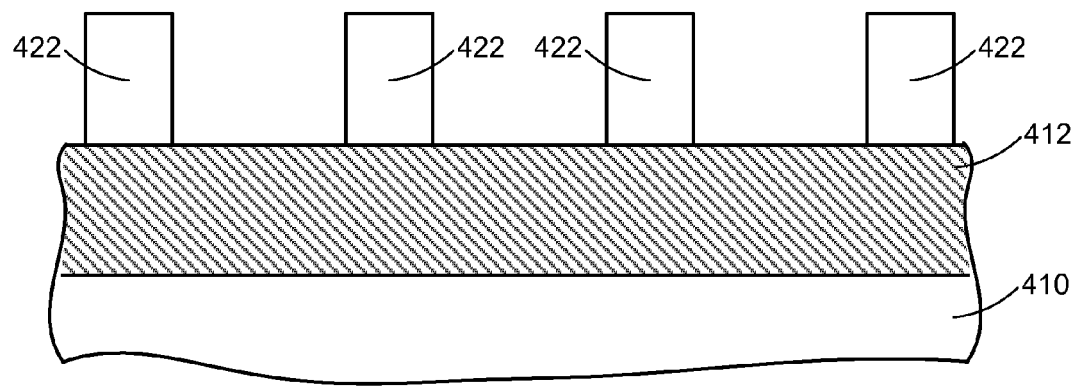
Figure 4D:
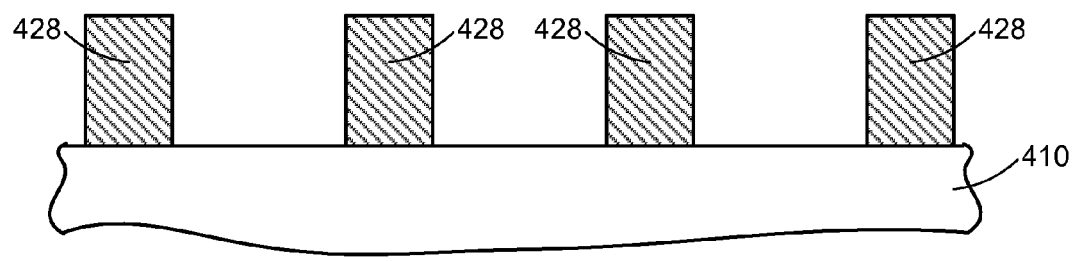
Figure 4E:
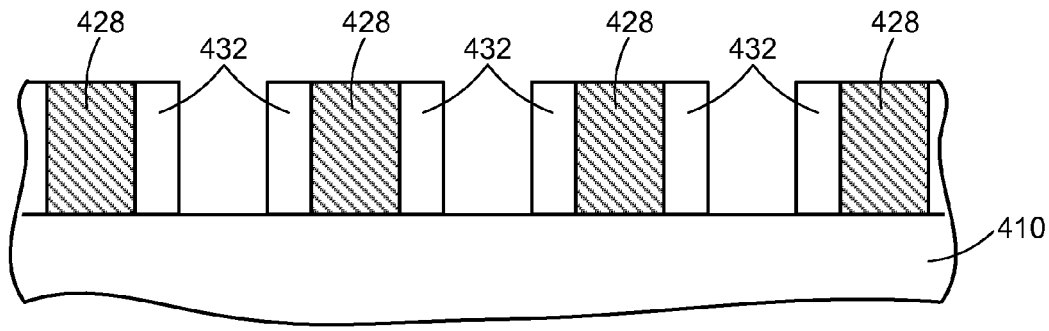

In FIG. 4C, after removing the cores 416, the resulting spacers 422 may be used as a hardmask for subsequent etching steps. In FIG. 4D, features 428 may be formed by etching the second layer 412 using the spacers 422 as a hardmask. In FIG. 4E, spacers 432 may be formed to the sides of features 428 (e.g., by conformally depositing a spacer layer and then using an anisotropic etch). In some cases, the spacer layer may include silicon dioxide or silicon nitride.

Figure 4F:
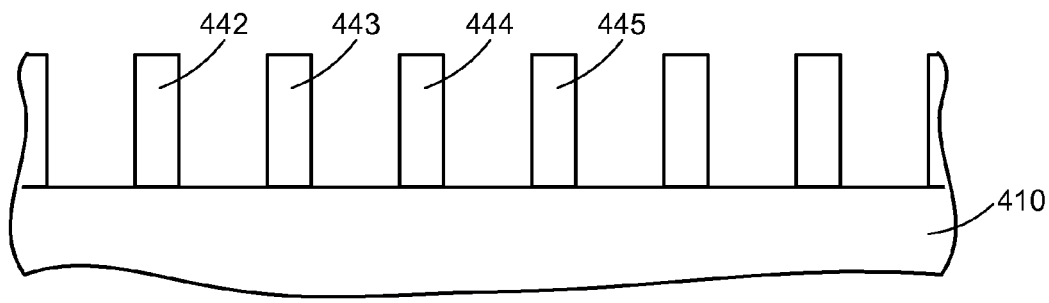

In FIG. 4F, after removal of the features 428, spacers 442-445 may comprise a group of four spacers. Spacer 442 and spacer 443 correspond with a line width of the core 416 from which they derive. Spacer 444 and spacer 445 correspond with a line spacing between cores 416. Spacer 444 derives from the same core 416 as spacers 442-443. Spacer 445 derives from a core 416 that was adjacent to the core 416 from which spacers 442-444 were derived. In one embodiment, the spacers 442-445 may be used as a hardmask for subsequent etching steps (e.g., to form bit lines corresponding with the spacers 442-445 using the first layer 410 or another layer below the spacers 442-445). In one embodiment, the first layer may comprise a refractory metal layer including tungsten or aluminum. The features created using the spacers 442-445 may have a feature density that is four times that of the cores 416 of FIG. 4B.

Figure 4G:
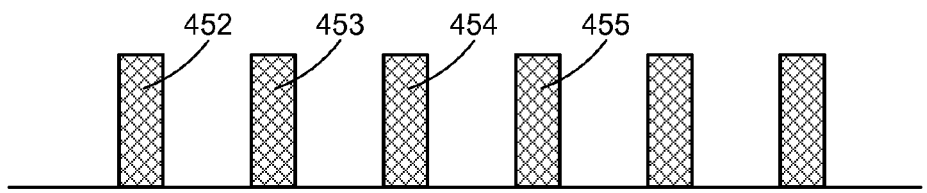

FIG. 4G depicts four bit lines 452-455 that have been formed using spacers 442-445 as a hardmask. In some cases, every fourth bit line of four neighboring (or adjacent) bit lines may be formed differently than the other three bit lines within the group of four bit lines (e.g., every fourth bit line may have a different line width than the other three bit lines in the group). The four neighboring bit lines may comprise an even/even bit line (e.g., bit line 452), an even/odd bit line (e.g., bit line 453), an odd/even bit line (e.g., bit line 454), and an odd/odd bit line (e.g., bit line 455).

In some embodiments, a spacer-based multiple patterning technique may include self-aligned double patterning lithography. In one embodiment, a positive double patterning technique may be applied in which spacers are used as hardmasks for subsequent etching steps. In another embodiment, a negative double patterning technique may be applied in which a gap filling material may be deposited after spacer formation and subsequently etched back to form one or more gap features (e.g., filling the space between spacers 432 in FIG. 4E that are not already filled by cores 428). The spacers may then be removed leaving the one or more gap features and/or cores remaining to be used as hardmasks for subsequent etching steps. In some cases, a positive double patterning technique may be applied prior to the application of a negative double patterning technique.

Figure 4H:
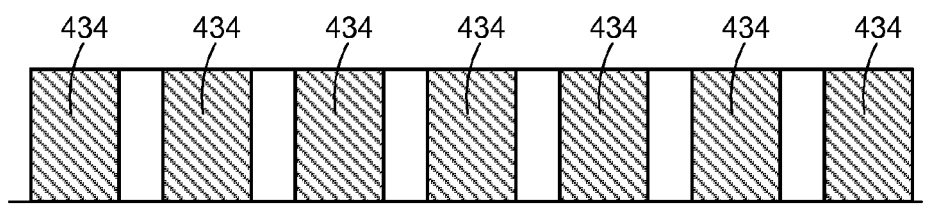

In FIG. 4H, rather than using spacers 432 of FIG. 4E as a hardmask for subsequent etching steps involving first layer 410, instead, an interconnect layer may be deposited and subsequently etched back to form interconnect lines 434 between the spacers 432. The interconnect lines 434 created using the spacers 432 may have a feature density that is four times that of the cores 416 of FIG. 4B.

Figure 5:
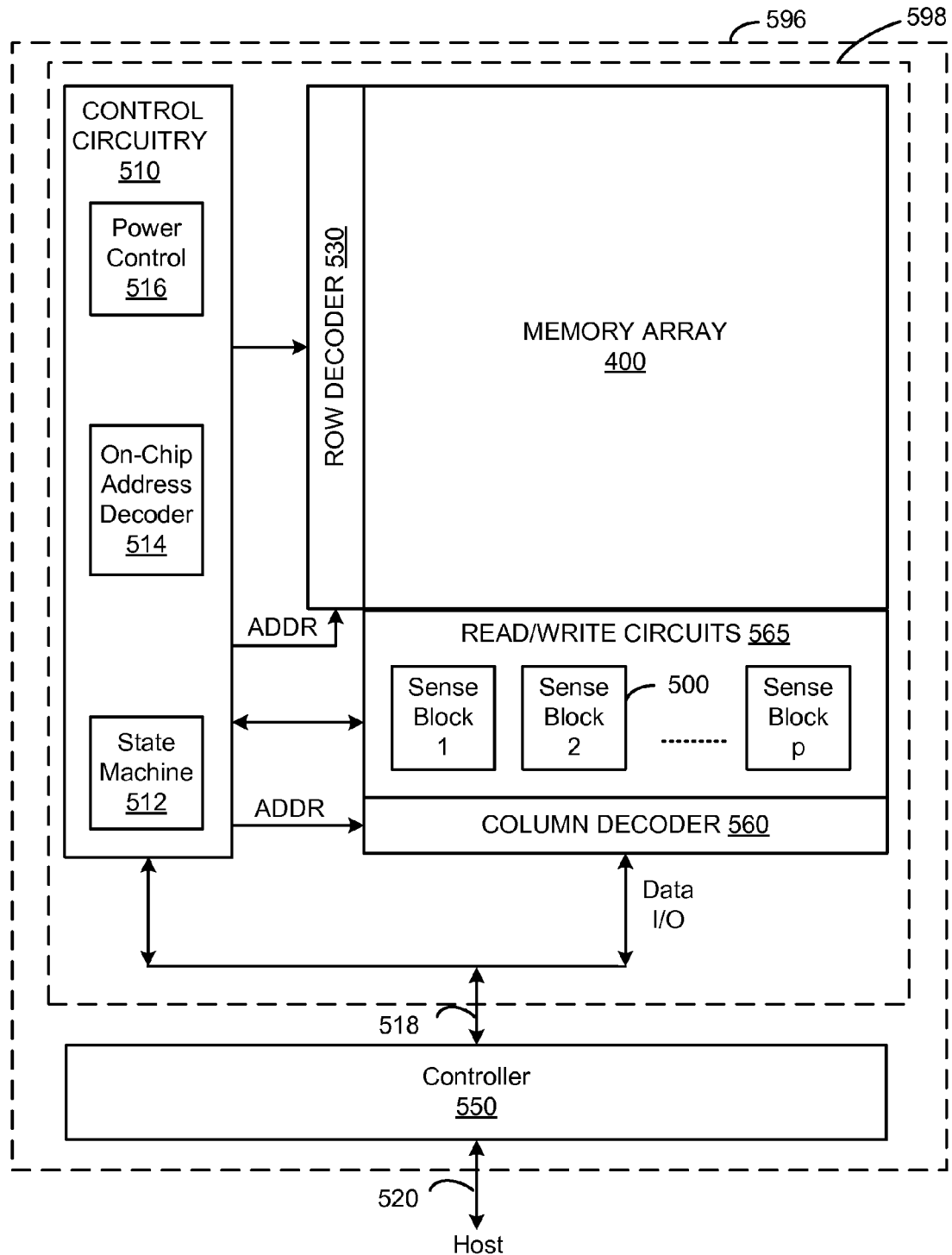
FIG. 5 depicts one embodiment of a non-volatile storage system including read/write circuits for reading and programming a page (or other unit) of memory cells.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
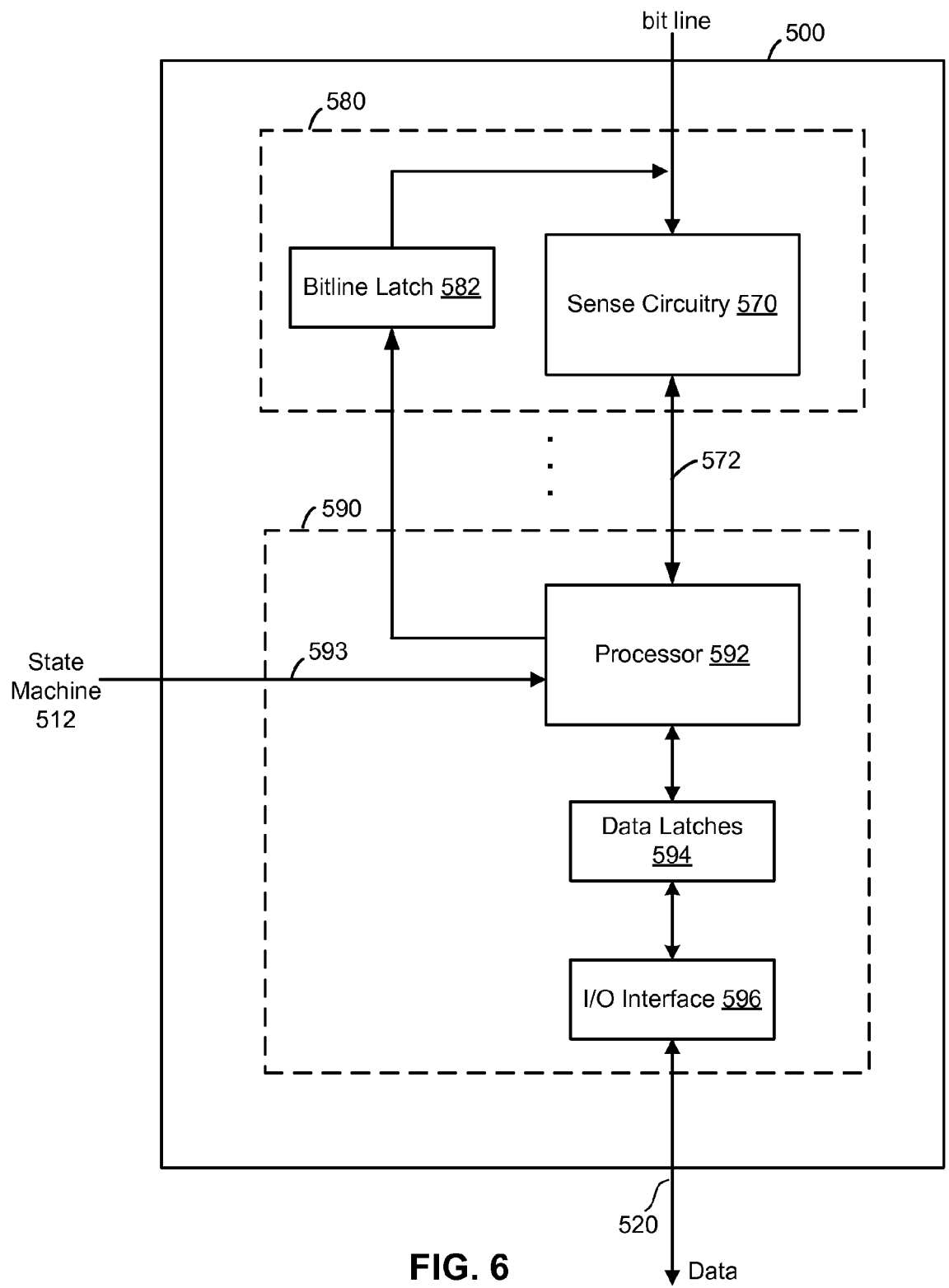
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
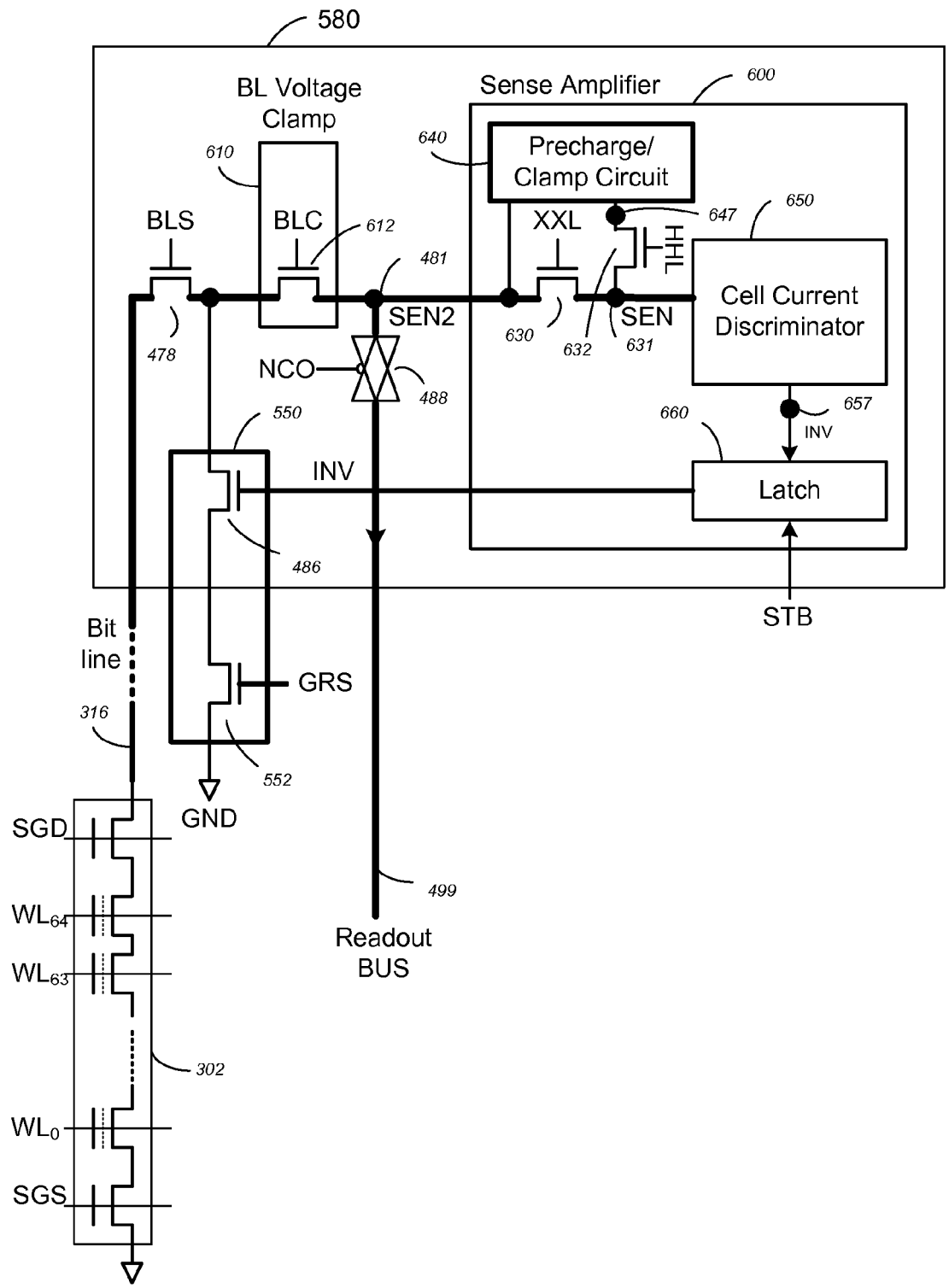
FIG. 7A depicts one embodiment of a sense module.

FIG. 7A depicts one embodiment of a sense module, such as sense module 580 in FIG. 6. As depicted, the sense module may sense the conduction current of a memory cell in a NAND string 302 via a coupled bit line 316. Sense module 580 has a sense node 481 that can be selectively coupled to a bit line, a sense amplifier 600, and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. One embodiment of a pre-charge/clamp circuit 640 is described later in reference to FIG. 7B. One embodiment of a cell current discriminator 650 is described later in reference to FIG. 7C.

In one embodiment, sense module 580 controls the voltages and limiting currents applied to bit line 316 and senses the conduction current of a selected memory cell in the NAND string 302. The sense module 580 may include a pull-down circuit 550, which includes transistors 486 and 552, for selectively pulling the bit line 316 to ground. The pull-down circuit 550 is activated when both the signal INV and another signal GRS are both HIGH. The sense module 580 may include a bit line voltage clamp 610, which may clamp the bit line voltage during sensing. Bit line voltage clamp 610 may operate as a source-follower with transistor 612 in series with the bit line 316. BLC may be set to roughly a threshold voltage above the desired bit line voltage (e.g., 0.5V or 0.7V) during sensing.

Figure 7B:
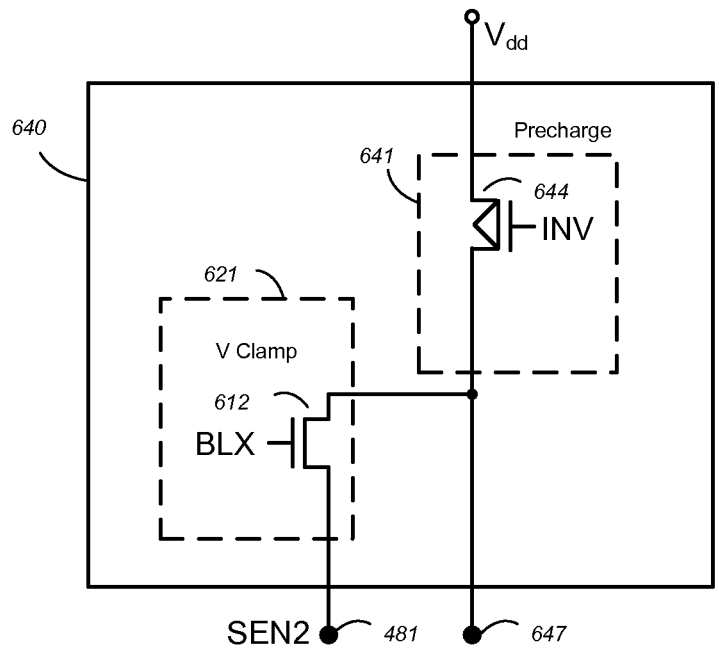
FIG. 7B depicts one embodiment of a pre-charge/clamp circuit.

FIG. 7B depicts one embodiment of a pre-charge/clamp circuit, such as pre-charge/clamp circuit 640 in FIG. 7A. The pre-charge/clamp circuit has a voltage clamp 621 component and a pre-charge circuit 641 component. The voltage clamp 621 is implemented by a transistor 612 controlled by an analog signal BLX at its gate. BLX is such that it ensures sufficient voltage on the node SEN2 481 (see FIG. 7A) so that the bit line voltage clamp 610 can function properly. The pre-charge circuit 641 is implemented by transistor 644 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 316 via the transistor 630 gated by a signal XXL.

Figure 7C:
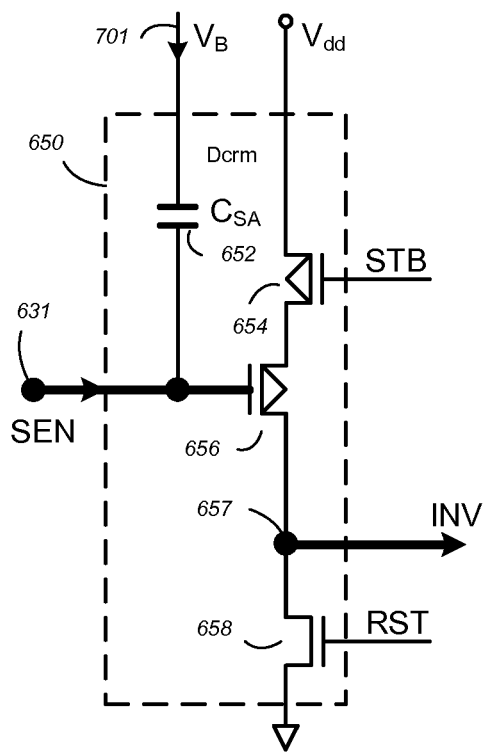
FIG. 7C depicts one embodiment of a cell current discriminator circuit.

FIG. 7C depicts one embodiment of a cell current discriminator circuit, such as cell current discriminator circuit 650 in FIG. 7A. The cell current discriminator 650 serves as a discriminator or comparator of current levels. It is coupled to the sense node to sense the conduction current in the memory cell. Cell current discriminator 650 includes a capacitor 652, p-channel transistor 656, transistors 654 and transistor 658. The cell current discriminator indirectly measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to VDD (HIGH) by the pre-charge circuit 641. Referring to FIG. 7A, the pre-charge is enabled by a signal HHL turning on the coupling transistor 632 so that the node SEN 651 is coupled to the pre-charge circuit 641 at node 647. This will initially set the voltage across the capacitor 652 to be zero. Sensing is then accomplished by measuring the memory cell's conduction current by the rate it discharges the capacitor.

In one embodiment, during sensing, the conduction current of the selected memory cell will discharge the capacitor 652. The voltage in the node SEN will then decrease from VDD at a rate depending on the conduction current. After a predetermined discharging period, the period corresponding with a reference current, SEN will drop to some value that may or may not turn on the measuring p-transistor 656. If it drops sufficiently low to turn on the p-transistor 656, it will mean that the conduction current is higher than the reference current. This will also result in the INV signal being pulled HIGH when the signal STB is asserted. On the other hand, if the transistor 656 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 630. The sensed result is then latched into the latch 660 based on a strobe signal STB. After the sensed result has been latched, signal NCO may be used to pass the state of the sense node 481 to the readout bus 499 via transfer gate 488.

In another embodiment, a cell current discriminator circuit may include a current mirror, which mirrors the current through the bit line, and a comparator which compares the mirrored current with a reference current. In some cases, a target reference current (or target cell current) may be injected into the bit line in order to facilitate current sensing.

Figure 8A:
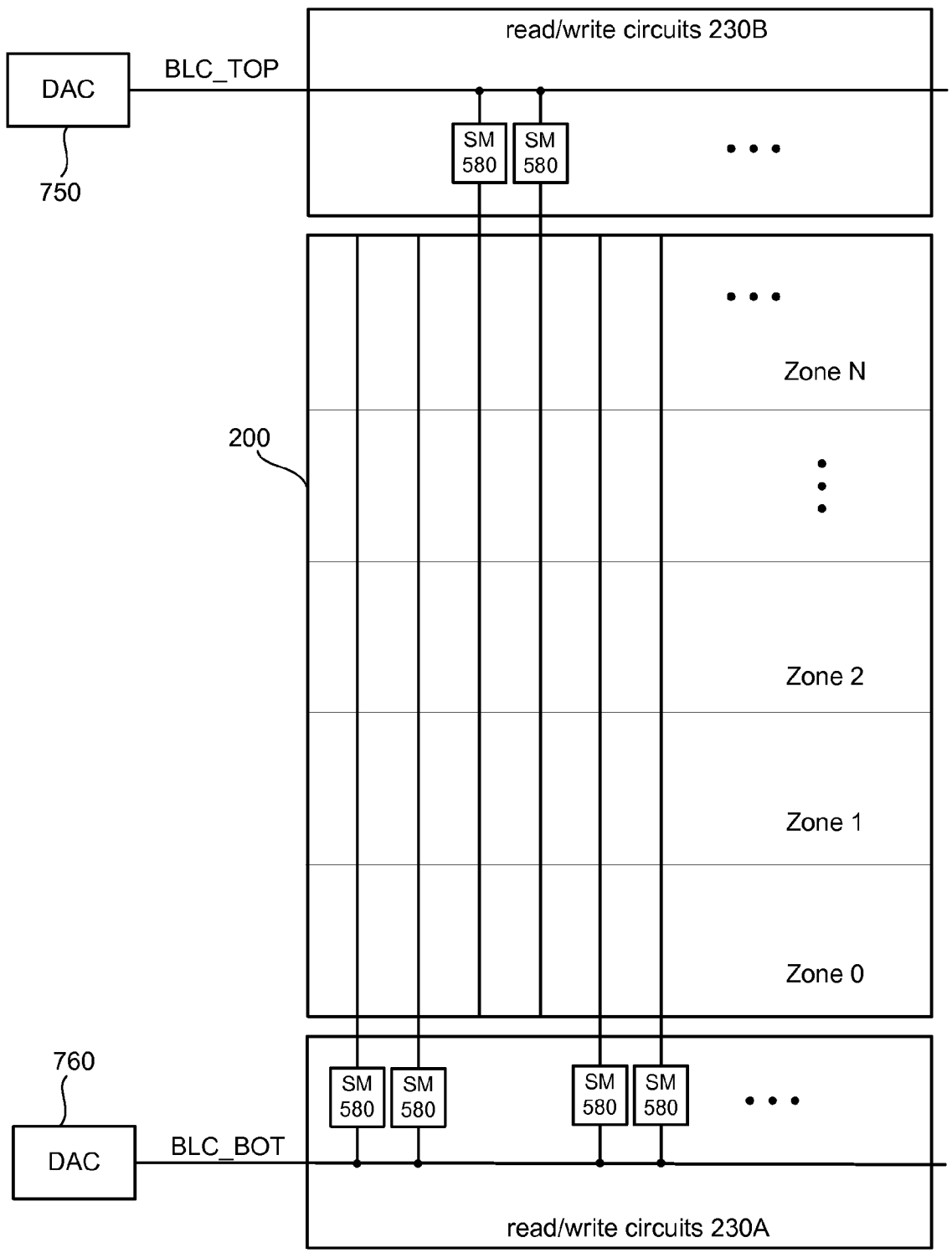
FIGS. 8A-8C depict various embodiments of a memory array and various read/write support circuits.

FIG. 8A depicts one embodiment of a memory array 200 and various read/write support circuits. Memory array 200 may comprise a memory plane or a portion of a memory plane. As depicted, read/write circuits 230A connect to bit lines at the bottom of the memory array 200 and read/write circuits 230B connect to bit lines at the top of the memory array 200. As depicted, two consecutive bit lines are connected to sense modules 580 on the bottom of the array (in read/write circuits 230A), the next two consecutive bit lines are connected to sense modules 580 on the top of the array (in read/write circuits 230B), the next two consecutive bit lines are connected to sense modules 580 on the bottom of the array (in read/write circuits 230A), the next two consecutive bit lines are connected to sense modules 580 on the top of the array (in read/write circuits 230B), and so on. Other arrangements can also be used, for example, eight (or another number) consecutive bit lines can be grouped on top/bottom.

One issue with having some of the sense modules on top of the array and other sense modules on the bottom of the array is that the line length of the bit line from a sense module to the word line selected for reading (and, therefore, to the memory cells selected for reading) may be different based on whether the sense modules are located on the top or bottom of the memory array. Because different memory cells may have different bit line lengths to the sense module and the bit lines resistance is based on the length of the bit line, the memory cells may experience different voltage drops due to different bit line resistances.

In order to read data from a memory cell, a corresponding bit line is pre-charged to a voltage appropriate for reading the memory cell. If the sense module is far from the memory cell, then the pre-charge voltage may have to be increased to account for the voltage drop due to bit line resistance. If a word line selected for reading is close to the bottom of the memory array 200, then those memory cells connected to sense modules 580 in read/write circuits 230A at the bottom of the memory array 200 will experience a lower voltage drop due to bit line resistance and those memory cells connected to sense modules 580 in read/write circuits 230B at the top of the memory array 200 will experience a higher voltage drop due to bit line resistance. If all sense modules are tuned to provide the same pre-charge voltage, then that pre-charge voltage must be large enough to account for the larger voltage drop of the memory cells connected to sense modules 580 in read/write circuits 230B at the top of the memory array 200. In one embodiment, the sense modules 580 may drive different voltages on the respective bit lines based on how far the selected word line (and, therefore, the selected memory cells) is from the respective sense modules. In one embodiment, the sense modules 580 in read/write circuits 230A at the bottom of the memory array 200 may provide a first bit line voltage while the sense modules 580 in read/write circuits 230B at the top of the memory array 200 may provide a second bit line voltage different from the first bit line voltage.

Referring to FIG. 8A, Digital-To-Analog Converter ("DAC") 750 and DAC 760 may be used to provide analog voltage signals that can be varied based on one or more control signals. In other embodiments, more or less than two DACs can be used. DAC 750 provides a signal BLC_TOP to the BLC input of sense modules 580 in read/write circuits 230B. The signal BLC_TOP determines the voltage applied to the bit lines by the respective sense modules 580 in read/write circuits 230B. DAC 760 provides a signal BLC_BOT to the BLC input of sense modules 580 in read/write circuits 230A. The signal BLC_BOT determines the voltage applied to the bit lines by the respective sense modules 580 in read/write circuits 230A.

In one embodiment, memory array 200 may be broken into zones. In one example, each zone includes one or more blocks. For example, an array of 2000 blocks can be grouped into ten zones of two hundred blocks each. Other groupings can also be used. In one example, each zone may be determined based on a range of row addresses or a range of word lines. As depicted, memory array 200 may be grouped into N zones. Zone 0 is closest to read/write circuits 230A. Zone N is closest to read/write circuits 230B. In some cases, each zone may be associated with one or more parameters for generating bit line voltages based on whether the sense modules are located at the bottom or top of the memory array 200. Each zone may be associated with one or more bit line voltages based on whether the sense modules are located at the bottom or top of the memory array 200.

In one example, if a word line is selected for reading from zone 0, then the sense modules in read/write circuits 230A may drive 150 mV on to the respective connected bit lines while the sense modules in read/write circuits 230B may drive 162 mV on to the respective connected bit lines. In another example, if a word line is selected for reading from zone N, then the sense modules in read/write circuits 230A may drive 162 mV on to the respective connected bit lines while the sense modules in read/write circuits 230B may drive 150 mV on to the respective connected bit lines. In another example, if a word line is selected for reading from zone 0, then the sense modules in read/write circuits 230A may drive 200 mV on to the respective connected bit lines while the sense modules in read/write circuits 230B may drive 400 mV on to the respective connected bit lines.

In some embodiments, as the bit line resistances may vary die-to-die and/or plane-to-plane, the bit lines voltages applied via the DACs may be trimmed based on settings specific to a particular die or a particular memory plane on a die. In some embodiments, for each die or each memory plane (or memory core) on a die, a plurality of bit line read voltages associated with a plurality of zones may be determined at sort based on sensing criteria and used for compensating for variations in bit line resistance during sensing. The sensing criteria may comprise a number of fail bits. Each zone of the plurality of zones may be associated with a memory array region within a die or memory plane (e.g., based on a block address or range of block addresses).

In some embodiments, within each zone, different bit line voltages may be applied to different bit line groupings in order to compensate for systematic process variations. In some cases, systematic variations in bit line resistance may occur between neighboring bit lines due to the use of multiple patterning lithography techniques such as spacer-based double patterning or quadruple spacer patterning.

In some cases, the multiple patterning lithography techniques may include a side-wall assisted process (SAP), wherein substantially vertical sidewalls are formed based on a first mask pattern and then a spacer mask is formed using the substantially vertical sidewalls. In this case, the line width and spacing of the first mask pattern may be twice that of the resulting spacer mask (i.e., the spacer mask may allow for twice the number of bit lines than the first mask pattern). Resulting bit lines formed in the line width area of the first mask pattern (e.g., odd bit lines) may be different from bit lines formed in the line spacing area of the first mask pattern (e.g., even bit lines). In one example, the bit lines formed in the line width area may be wider (and less resistive) than the bit lines formed in the line spacing area. A double side-wall assisted process (DSAP) may be used to obtain four times the bit line density than an initial line width and spacing pattern by repeating SAP twice. In this case, every fourth bit line of four neighboring (or adjacent) bit lines may be formed differently than the other three bit lines within the group of four bit lines (e.g., every fourth bit line may have a different line width than the other three bit lines in the group). The four neighboring bit lines may comprise an even/even bit line, an even/odd bit line, an odd/even bit line, and an odd/odd bit line.

In some embodiments, different bit lines voltages may be applied to different bit line groupings. In one example, a first bit line voltage may be applied to even bit lines and a second bit line voltage different from the first bit line voltage may be applied to odd bit lines. In another example, a first bit line voltage may be applied to a first bit line, a second bit line voltage may be applied to a second bit line adjacent to the first bit line, a third bit line voltage may be applied to a third bit line adjacent to the second bit line, and a fourth bit line voltage may be applied to a fourth bit line adjacent to the third bit line. The first bit line voltage may be applied to a fifth bit line adjacent to the fourth bit line. In some cases, the use of four different bit line voltages may be repeated for every adjacent grouping of four bit lines. Other groupings of neighboring bit lines may also be used (e.g., eight different bit line voltages may be repeated for every adjacent grouping of eight bit lines).

In some embodiments, a first bit line voltage may be applied to a first set of bit lines and a second bit line voltage different from the first bit line voltage may be applied to a second set of bit lines. In some cases, the first set of bit lines may correspond with a first bit line region (e.g., a left side of a memory array) and the second set of bit lines may correspond with a second bit line region (e.g., a right side of a memory array). In other cases, the first set of bit lines may correspond with even bit lines and the second set of bit lines may correspond with odd bit lines. The first set of bit lines and the second set of bit lines may be interdigitated or interleaved with each other.

Figure 8B:
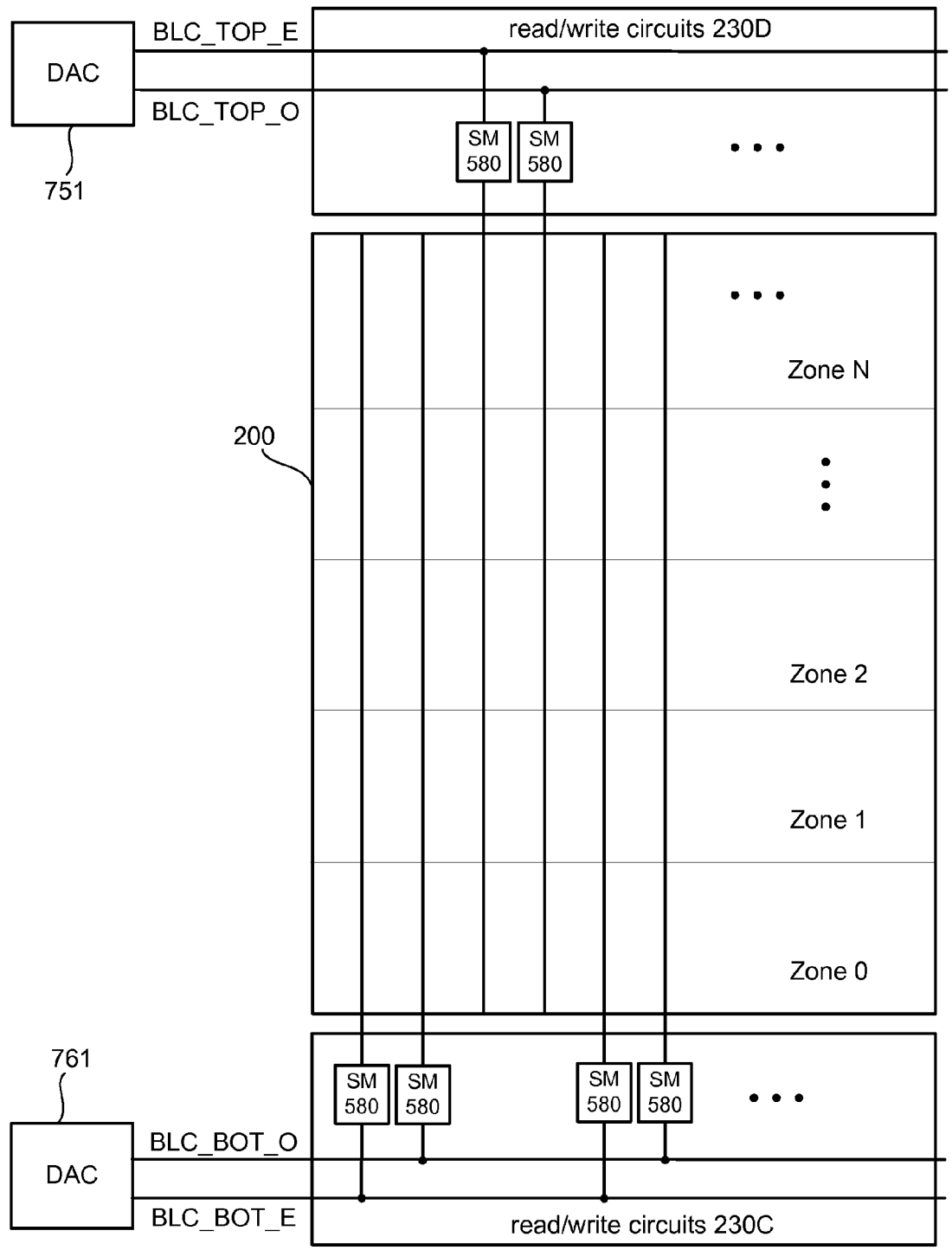

FIG. 8B depicts one embodiment of a memory array 200 and various read/write support circuits. Memory array 200 may comprise a memory plane or a portion of a memory plane. As depicted, read/write circuits 230C connect to bit lines at the bottom of the memory array 200 and read/write circuits 230D connect to bit lines at the top of the memory array 200. As depicted, two consecutive bit lines are connected to sense modules 580 on the bottom of the array (in read/write circuits 230C), the next two consecutive bit lines are connected to sense modules 580 on the top of the array (in read/write circuits 230D), the next two consecutive bit lines are connected to sense modules 580 on the bottom of the array (in read/write circuits 230C), the next two consecutive bit lines are connected to sense modules 580 on the top of the array (in read/write circuits 230D), and so on. Other arrangements can also be used, for example, eight (or another number) consecutive bit lines can be grouped on top/bottom.

As depicted, DAC 751 and DAC 761 may be used to provide analog voltage signals that can be varied based on one or more control signals. In other embodiments, more or less than two DACs can be used. DAC 751 provides two voltage signals BLC_TOP_E and BLC_TOP_O to the BLC inputs of sense modules 580 in read/write circuits 230D. The signal BLC_TOP_E determines the voltage applied to the bit lines by sense modules 580 in read/write circuits 230D that are driving even bit lines from the top of the array. The signal BLC_TOP_O determines the voltage applied to the bit lines by sense modules 580 in read/write circuits 230D that are driving odd bit lines from the top of the array. DAC 761 provides two voltage signals BLC_BOT_E and BLC_BOT_O to the BLC inputs of sense modules 580 in read/write circuits 230C. The signal BLC_BOT_E determines the voltage applied to the bit lines by sense modules 580 in read/write circuits 230C that are driving even bit lines from the bottom of the array. The signal BLC_BOT_O determines the voltage applied to the bit lines by sense modules 580 in read/write circuits 230C that are driving odd bit lines from the bottom of the array. Thus, the read/write support circuits may provide different bit line voltages to different bit line groupings. In this case, the use of four different bit line voltages (two from the top and two from the bottom) may be repeated for every adjacent grouping of four bit lines.

In one example, if a word line is selected for reading from zone 0, then the sense modules in read/write circuits 230C may drive 200 mV on to the even bit lines driven from the bottom of the array and 250 mV on to the odd bit lines driven from the bottom of the array, while the sense modules in read/write circuits 230D may drive 400 mV on to the even bit line driven from the top of the array and 375 mV on to the odd bit lines driven from the top of the array.

Figure 8C:
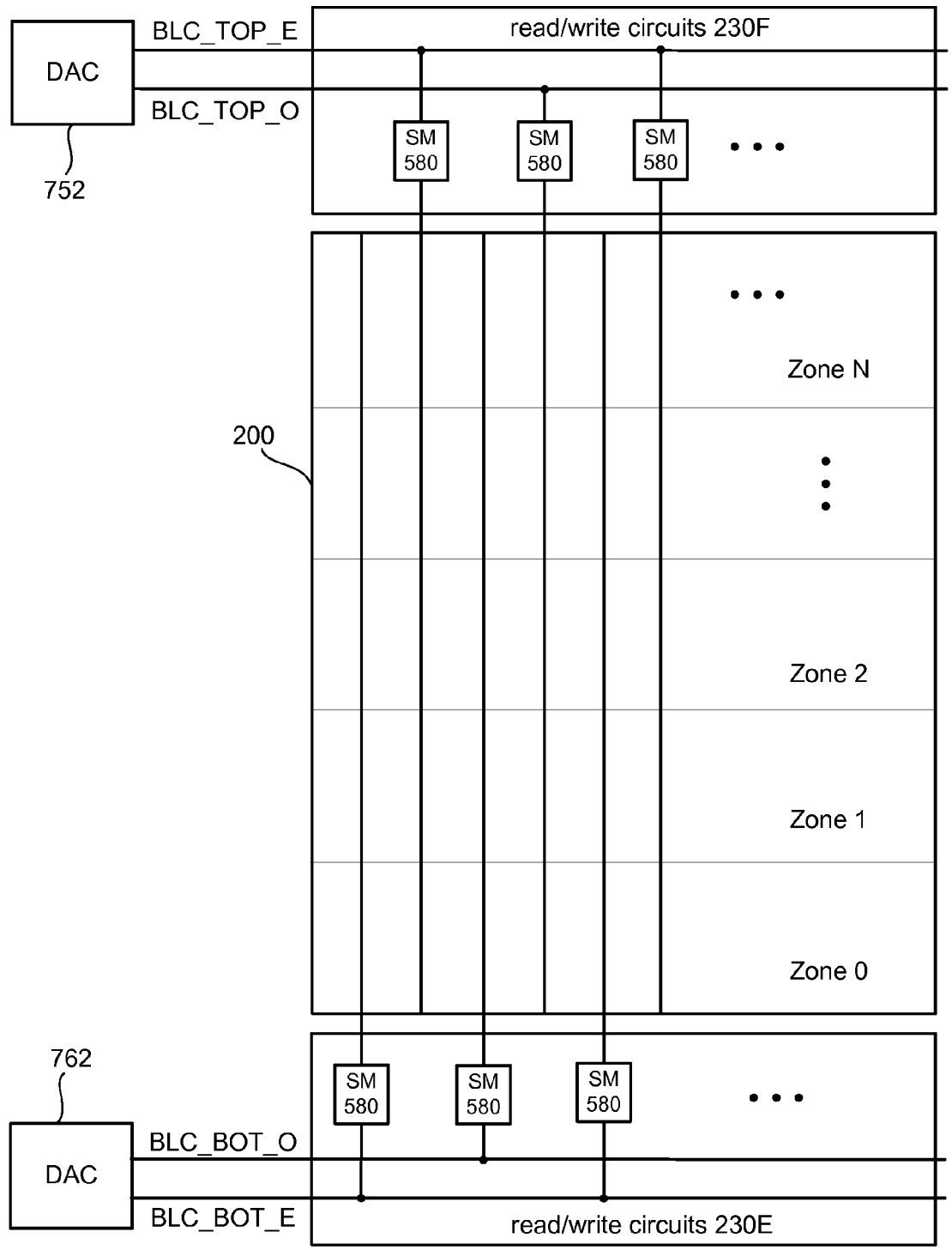

FIG. 8C depicts one embodiment of a memory array 200 and various read/write support circuits. Memory array 200 may comprise a memory plane or a portion of a memory plane. As depicted, read/write circuits 230E connect to bit lines at the bottom of the memory array 200 and read/write circuits 230F connect to bit lines at the top of the memory array 200. As depicted, even bit lines are connected to sense modules 580 on the bottom of the array (in read/write circuits 230E) and odd bit lines are connected to sense modules 580 on the top of the array (in read/write circuits 230F). In other cases, the read/write circuits at the bottom of the array may drive odd bit lines (rather than even bit lines) and the read/write circuits at the top of the array may drive even bit lines (rather than odd bit lines).

As depicted, DAC 752 and DAC 762 may be used to provide analog voltage signals that can be varied based on one or more control signals. In other embodiments, more or less than two DACs can be used. DAC 752 provides two voltage signals BLC_TOP_E and BLC_TOP_O to the BLC inputs of sense modules 580 in read/write circuits 230F. The signal BLC_TOP_E determines the voltage applied to the bit lines by sense modules 580 in read/write circuits 230F that are driving a first set of odd bit lines from the top of the array (e.g., every other odd bit line). The signal BLC_TOP_O determines the voltage applied to the bit lines by sense modules 580 in read/write circuits 230F that are driving a second set of odd bit lines from the top of the array (e.g., every other odd bit line offset from the first set of odd bit lines). DAC 762 provides two voltage signals BLC_BOT_E and BLC_BOT_O to the BLC inputs of sense modules 580 in read/write circuits 230E. The signal BLC_BOT_E determines the voltage applied to the bit lines by sense modules 580 in read/write circuits 230E that are driving a first set of even bit lines from the bottom of the array (e.g., every other even bit line). The signal BLC_BOT_O determines the voltage applied to the bit lines by sense modules 580 in read/write circuits 230E that are driving a second set of even bit lines from the bottom of the array (e.g., every other even bit line offset from the first set of even bit lines). Thus, the read/write support circuits may provide different bit line voltages to different bit line groupings. In this case, the use of four different bit line voltages (two from the top and two from the bottom) may be repeated for every adjacent grouping of four bit lines.

In one example, if a word line is selected for reading from zone 0, then the sense modules in read/write circuits 230E may drive 200 mV on to a first set of even bit lines driven from the bottom of the array and 250 mV on to a second set of even bit lines driven from the bottom of the array, while the sense modules in read/write circuits 230F may drive 400 mV on to a first set of odd bit lines driven from the top of the array and 375 mV on to a second set of odd bit lines driven from the top of the array.

Figure 9A:
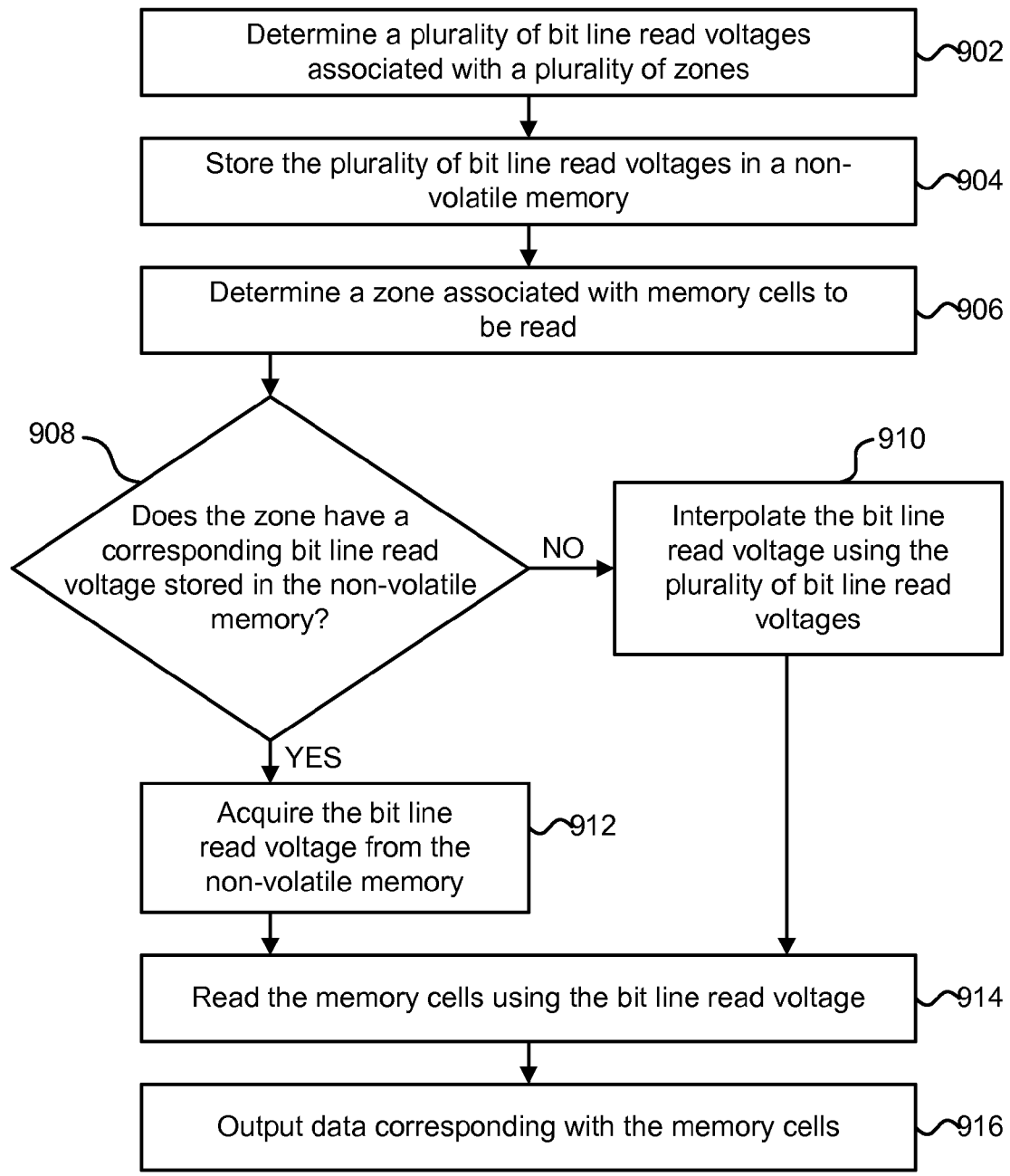
FIG. 9A is a flowchart describing one embodiment of a process for compensating for die-to-die and/or plane-to-plane variations in bit line resistance during sensing of memory cells.

FIG. 9A is a flowchart describing one embodiment of a process for compensating for die-to-die and/or plane-to-plane variations in bit line resistance during sensing of memory cells. In one embodiment, the process of FIG. 9A may be performed by a non-volatile storage system, such as non-volatile storage system 596 in FIG. 5.

In step 902, a plurality of bit line read voltages associated with a plurality of zones is determined. In some embodiments, for each die or each memory plane (or memory core) on a die, the plurality of bit line read voltages may be determined based on sensing criteria. In one example, the sensing criteria may comprise a number of fail bits. In another example, the sensing criteria may comprise a particular memory cell source current. Each zone of the plurality of zones may be associated with a memory array region within a die or memory plane. In one example, a zone may be associated with one or more blocks (or one or more block addresses). In another example, a zone may be associated with a set of word lines (or a range of row addresses). In one embodiment, the plurality of zones may include a near zone corresponding with a near block within a memory plane (or memory core) and a far zone corresponding with a far block within the memory plane (or memory core). The plurality of bit line read voltages may comprise a near bit line read voltage associated with the near zone and far bit line read voltage associated with the far zone.

In some cases, the plurality of bit line read voltages associated with a plurality of zones used for compensating for variations in bit line resistance may be determined during wafer sort, die sort, or after packaging. In one embodiment, the plurality of bit line read voltages associated with a plurality of zones may be determined during a power-up or reset sequence and stored in a non-volatile memory. In one embodiment, the determination of the plurality of bit line read voltages associated with the plurality of zones may be performed by one or more managing circuits (e.g., by a combination of control circuitry 510, state machine 512, decoders 530/560, power control 516, and read/write circuits 565 in FIG. 5).

Each of the plurality of bit line read voltages may correspond with a different zone of the plurality of zones. In one example, a memory plane may include 16 blocks corresponding with 16 zones and the plurality of bit line read voltages may comprise 16 bit line read voltages corresponding with each of the 16 zones. In another example, a memory plane may include 16 blocks corresponding with 16 zones and the plurality of bit line read voltages may comprise two bit line read voltages corresponding with a top zone of the 16 zones and a bottom zone of the 16 zones. In another example, a memory plane may include 16 blocks corresponding with 16 zones and the plurality of bit line read voltages may comprise four bit line read voltages including two bit line read voltages associated with a top zone and two bit line read voltages associated with a bottom zone. The two bit line read voltages associated with the top zone may correspond with a first bit line read voltage for use by sense amplifiers at the top of a memory array and a second bit line read voltage for use by sense amplifiers at the bottom of a memory array (i.e., the sense amplifiers or sense modules may be split).

In some embodiments, the plurality of bit line read voltages may comprise one or more sets of bit line read voltages, wherein each set of the one or more sets of bit line read voltages corresponds with a different zone of the plurality of zones. In one example, a memory plane may include 16 blocks corresponding with 16 zones and the one or more sets of bit line read voltages may include a first set of bit line read voltages corresponding with a top zone of the 16 zones and a second set of bit line read voltages corresponding with a bottom zone of the 16 zones. In some cases, the first set of bit line read voltages may include four bit line read voltages associated with four different groupings of bit lines within the top zone. In other cases, the first set of bit line read voltages may include an even bit line read voltage associated with a grouping of even bit lines within the top zone and an odd bit line read voltage associated with a grouping of odd bit lines within the top zone. The use of one or more sets of bit line read voltages per zone for providing different bit line voltages to different bit line groupings may be used to compensate for systematic process variations between the different bit line groupings (e.g., systematic variations in bit line resistance between even and odd bit lines due to the use of multiple patterning lithography techniques such as spacer-based double patterning).

Various embodiments of processes for determining a plurality of bit line read voltages associated with a plurality of zones are described later in reference to FIG. 9B and FIG. 10.

Referring to FIG. 9A, in step 904, the plurality of bit line read voltages is stored in a non-volatile memory. The non-volatile memory may be located on the same memory die in which the plurality of zones is located. The non-volatile memory may comprise a configuration portion of a memory array or a dedicated configuration bit memory located on the same die as the plurality of zones. The configuration portion of a memory array and/or the dedicated configuration bit memory may include significant bit redundancy in order to provide for robust non-volatile storage of the plurality of bit line read voltages or various parameters for determining the plurality of bit line read voltages.

In step 906, a zone associated with memory cells to be read and/or verified is determined. In one embodiment, the zone may be determined using a block address. In another embodiment, the zone may be determined using a range of row addresses and/or a range of column addresses. As the location of sense amplifiers associated with a memory plane may be split (e.g., half of the sense amplifiers are located at the top of a memory plane and the other half of the sense amplifiers are located at the bottom of the memory plane), column address information may be used to determine whether a sense amplifier is located at the top or bottom of the memory plane. If the layout of sense amplifiers associated with a memory plane is split, then sense amplifiers located near the top of the memory plane will be located farthest away from NAND strings located near the bottom of the memory plane and sense amplifiers located near the bottom of the memory plane will be located farthest away from NAND strings located near the top of the memory plane. In another embodiment, the zone may be determined using both block address information and column address information.

In step 908, it is determined whether the zone has a corresponding bit line read voltage stored in the non-volatile memory (e.g., a configuration bit memory). If it is determined that the zone has a corresponding bit line read voltage stored in the non-volatile memory, then step 912 is performed. Otherwise, if it is determined that the zone does not have a corresponding bit line read voltage stored in the non-volatile memory, then step 910 is performed. In one embodiment, a lookup table or content addressable memory (CAM) may be used to determine whether the zone has a corresponding bit line read voltage stored in the non-volatile memory.

In step 910, the bit line read voltage is interpolated using the plurality of bit line read voltages. In one embodiment, linear interpolation is performed using a first bit line read voltage of the plurality of bit line read voltages associated with a first zone located above the zone and a second bit line read voltage of the plurality of bit line read voltages associated with a second zone located below the zone. In one example, the first zone located above the zone may correspond with the closest zone located above the zone and the second zone located below the zone may correspond with the closest zone located below the zone. In some cases, the first zone located above the zone may correspond with a near block and the second zone located below the zone may correspond with a far block.

In step 912, the bit line read voltage is acquired from the non-volatile memory based on the zone. In step 914, the memory cells are read (or sensed) using the bit line read voltage. In step 916, data corresponding with the memory cells is outputted.

Figure 9B:
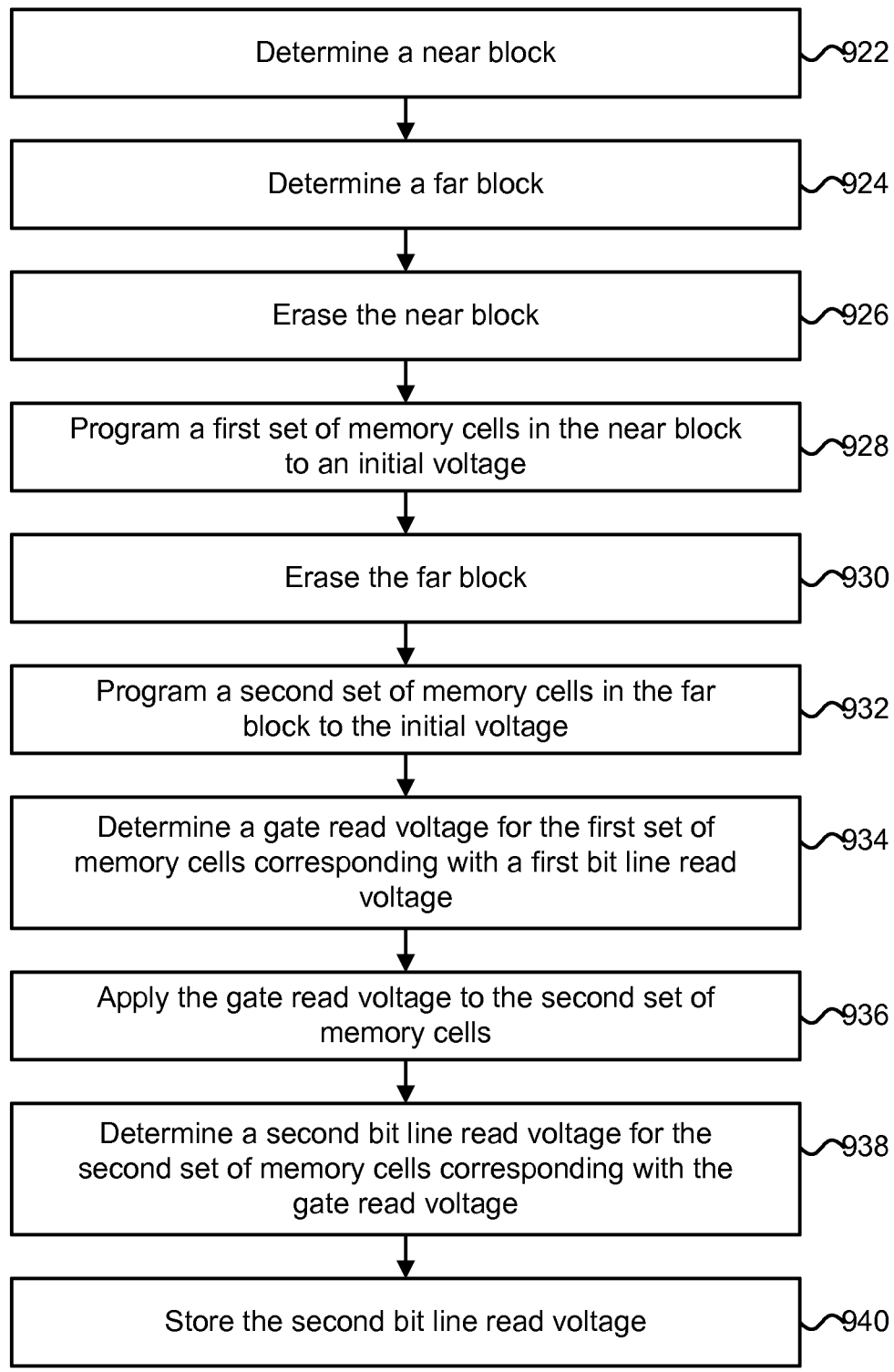
FIG. 9B is a flowchart describing one embodiment of a process for determining a plurality of bit line read voltages associated with a plurality of zones.

FIG. 9B is a flowchart describing one embodiment of a process for determining a plurality of bit line read voltages associated with a plurality of zones. The process described in FIG. 9B is one example of a process for implementing step 902 in FIG. 9A. In one embodiment, the process of FIG. 9B may be performed by a non-volatile storage system, such as non-volatile storage system 596 in FIG. 5.

In step 922, a near block is determined. In one embodiment, the near block comprises a block that passes various sort criteria such as having less than a particular number of failures, bad bits, word line shorts, and/or bit line shorts. In some cases, as a near block may be located close to a corresponding sense amplifier, the bit line IR drop may be very small or negligible as compared with the bit line IR drop to other blocks located farther away from the sense amplifier.

In one embodiment, the near block may comprise a top block (or the topmost block within a memory plane). In another embodiment, the near block may comprise a bottom block (or the bottommost block within a memory plane). In some cases where the layout of sense amplifiers is split, the near block may be relative to the location of sense amplifiers associated with a memory plane. For example, the near block may comprise a top block for sense amplifiers located near the top block, while the near block may comprise a bottom block for sense amplifiers located near the bottom block.

In step 924, a far block is determined. In one embodiment, the far block comprises a block that passes various sort criteria such as having less than a particular number of failures, bad bits, word line shorts, and/or bit line shorts. The far block may comprise the block farthest away from sense amplifiers associated with a memory plane. In step 926, the near block is erased. In one embodiment, the near block may be erased without performing soft programming to tighten the erase distribution.

In step 928, a first set of memory cells in the near block is programmed to an initial voltage. The programming of the first set of memory cells to the initial voltage may be used to determine the same initial threshold voltage distribution for a second set of memory cells in a far block as that of the first set of memory cells. The first set of memory cells may be associated with one or more word lines in the near block. In one example, the first set of memory cells may comprise memory cells corresponding with even bit lines and connected to a particular word line in the near block. In some cases, to mitigate bit line coupling from neighboring bit lines, odd/even programming may be performed, wherein memory cells connected to odd bit lines are programmed at a different time than memory cells connected to even bit lines. In one embodiment, the first set of memory cells may be programmed to the initial voltage without performing a read verify. The first set of memory cells may be programmed using a fixed number of program pulses.

The verification of the first set of memory cells after programming of the first set of memory cells may be performed using voltage sensing or current sensing. One disadvantage of using current sensing is that a constant IR voltage drop may occur due to an injection of sensing current into a bit line during sensing of a selected memory cell. During voltage sensing, a bit line may be pre-charged to a bit line voltage and then allowed to float while a discharge path is conditionally enabled (e.g., based on a threshold voltage of a selected memory cell).

In step 930, the far block is erased. In one embodiment, the far block may be erased without performing soft programming to tighten the erase distribution.

In step 932, a second set of memory cells in the far block is programmed to the initial voltage. The programming of the second set of memory cells to the initial voltage may be used to determine the same initial threshold voltage distribution for the second set of memory cells in the far block as that of the first set of memory cells. The second set of memory cells may be associated with one or more word lines in the far block. In one example, the second set of memory cells may comprise memory cells corresponding with even bit lines and connected to a particular word line in the far block. In some cases, to mitigate bit line coupling from neighboring bit lines, odd/even programming may be performed, wherein memory cells connected to odd bit lines are programmed at a different time than memory cells connected to even bit lines. In one embodiment, the second set of memory cells may be programmed to the initial voltage without performing a read verify.

The verification of the second set of memory cells after programming of the first set of memory cells may be performed using voltage sensing or current sensing. One disadvantage of using current sensing is that a constant IR voltage drop may occur due to an injection of sensing current into a bit line during sensing of a selected memory cell. During voltage sensing, a bit line may be pre-charged to a bit line voltage and then allowed to float while a discharge path is conditionally enabled (e.g., based on a threshold voltage of a selected memory cell).

In step 934, a gate read voltage for the first set of memory cells is determined corresponding with a first bit line read voltage. The first bit line read voltage may be associated with a target memory cell drain voltage. In one embodiment, the near block is selected and the gate read voltage is swept until the first set of memory cells satisfies a sensing criterion. In one example, the sensing criterion may comprise a number of fail bits (e.g., 32, 128, 256, or 512 read bit failures). In another example, the sensing criterion may comprise a target source current, wherein the target source current may be measured by the current passing through the source line associated with a particular block.

In some cases, the first set of memory cells may be sensed using voltage sensing or current sensing. The current sensing may comprise all-bit-line (ABL) sensing. Thus, in one embodiment, the read verification of the first set of memory cells during the initial programming to the initial voltage may use a first sensing method (e.g., voltage sensing) and the sensing of the first set of memory cells while determining the gate read voltage may use a second sensing method different from the first sensing method (e.g., current sensing). Using voltage sensing as the first sensing method mitigates the static IR drop which occurs during current sensing. Using current sensing as the second sensing method allows the IR drops along bit lines to be taken into account assuming that a read operation will eventually perform a read using current sensing.

In one embodiment, the gate read voltage may be determined by performing a read operation on the first set of memory cells using an initial gate read voltage, determining a number of fail bits associated with the read operation, determining whether the number of fail bits satisfies a sensing criterion, and increasing (e.g., in step size increments) the gate read voltage if the number of fail bits is greater than the number of fail bits associated with the sensing criterion. In another embodiment, the gate read voltage may be determined by performing a read operation on the first set of memory cells using an initial gate read voltage, determining a number of fail bits associated with the read operation, determining whether the number of fail bits is greater than the number of fail bits associated with a sensing criterion, and reducing the gate read voltage if the number of fail bits is less than the number of fail bits associated with the sensing criterion.

In one embodiment, the first set of memory cells may correspond with a first grouping of bit lines. In one example, the first grouping of bit lines may be associated with a grouping of even bit lines (e.g., bit line 0, bit line 2, bit line 4, etc.). In another example, the first grouping of bit lines may be associated with a grouping of odd bit lines (e.g., bit line 1, bit line 3, bit line 5, etc.). In another example, the first grouping of bit lines may correspond with a grouping of every fourth bit line (e.g., bit line 0, bit line 4, bit line 8, bit line 12, etc.).

One embodiment of a process for determining a gate read voltage associated with a first set of memory cells is described later in reference to FIG. 9C.

In step 936, the gate read voltage is applied to the second set of memory cells. In one embodiment, the gate read voltage is applied to a particular word line associated with the second set of memory cells.

In step 938, a second bit line read voltage for the second set of memory cells is determined corresponding with the gate read voltage. The second bit line read voltage applied to the second set of memory cells may be greater than the first bit line read voltage applied to the first set of memory cells in order to compensate for increased IR voltage drops along bit lines connected to both the first set of memory cells and the second set of memory cells. In one embodiment, the second bit line read voltage may be determined by performing a read operation on the second set of memory cells, determining a number of fail bits associated with the read operation, determining whether the number of fail bits corresponds with sensing criteria, and increasing the bit line read voltage if the number of fail bits is greater than the number of fail bits associated with the sensing criteria.

In one embodiment, the far block may be selected and the bit line read voltage swept (e.g., in step size increments) until the second set of memory cells satisfies sensing criteria. In one example, the sensing criteria may comprise a number of fail bits (e.g., 32, 128, 256, or 512 read bit failures). In some cases, the bit line read voltage may be swept using a zone-based digital to analog converter (DAC). In step 940, the second bit line read voltage is stored. The second bit line read voltage may be stored in a non-volatile memory and tagged as being associated with the far block.

In one embodiment, the second set of memory cells may correspond with a second grouping of bit lines. In one example, the second grouping of bit lines may be associated with a grouping of even bit lines (e.g., bit line 0, bit line 2, bit line 4, etc.). In another example, the second grouping of bit lines may be associated with a grouping of odd bit lines (e.g., bit line 1, bit line 3, bit line 5, etc.). In another example, the second grouping of bit lines may correspond with a grouping of every fourth bit line (e.g., bit line 0, bit line 4, bit line 8, bit line 12, etc. or bit line 1, bit line 5, bit line 9, bit line 13, etc.).

One embodiment of a process for determining a bit line read voltage associated with a second set of memory cells is described later in reference to FIG. 9D.

Figure 9C:
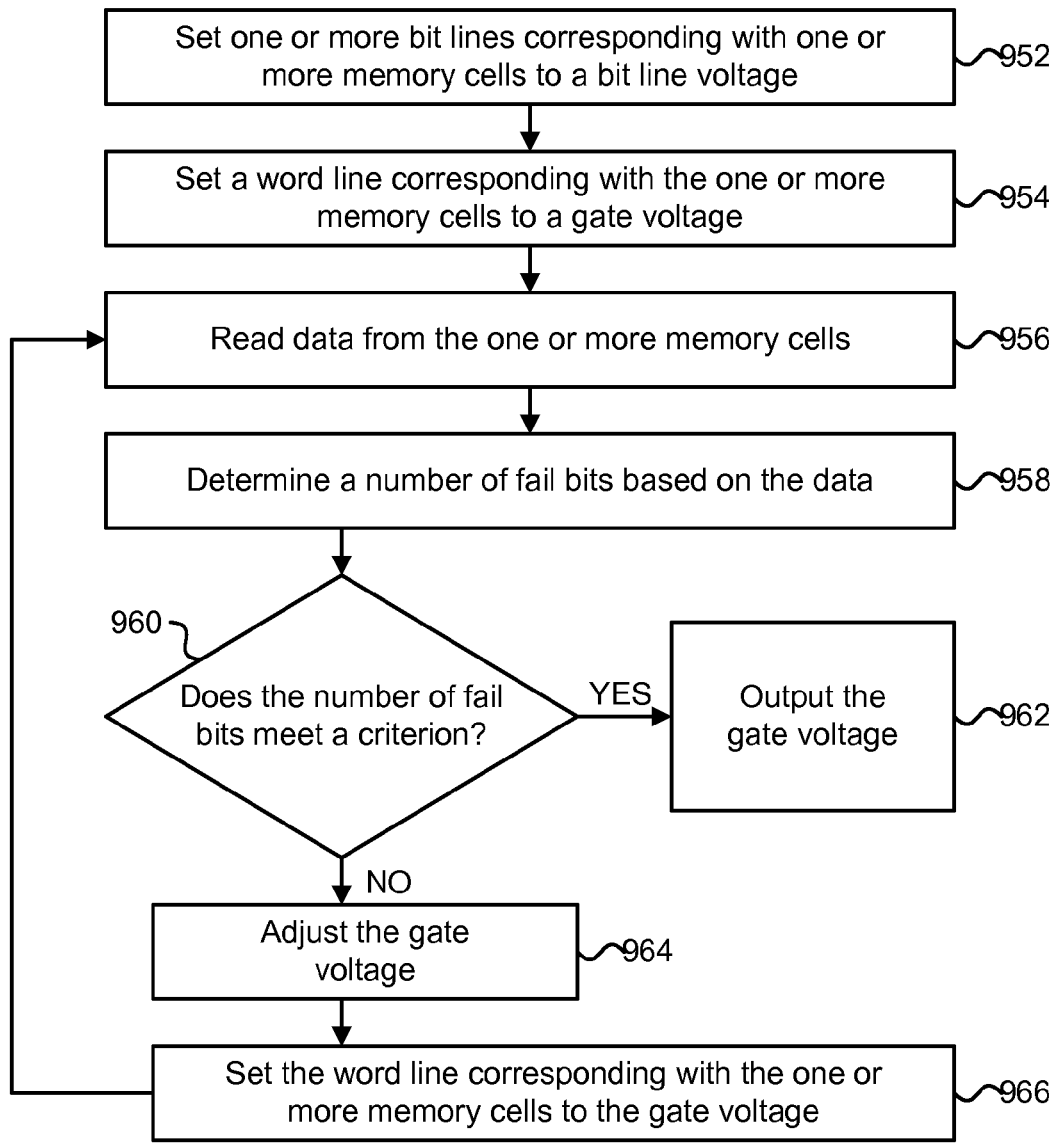
FIG. 9C is a flowchart describing one embodiment of a process for determining a gate read voltage associated with a first set of memory cells.

FIG. 9C is a flowchart describing one embodiment of a process for determining a gate read voltage associated with a first set of memory cells. The process described in FIG. 9C is one example of a process for implementing step 934 in FIG. 9B. In one embodiment, the process of FIG. 9C may be performed by a non-volatile storage system, such as non-volatile storage system 596 in FIG. 5.

In step 952, one or more bit lines corresponding with one or more memory cells are set to a bit line voltage. In step 954, a word line corresponding with the one or more memory cells is set to a gate voltage. In step 956, data is read from the one or more memory cells. In step 958, a number of fail bits is determined based on the data read from the one or more memory cells. In step 960, it is determined whether the number of fail bits meets a criterion. If the number of fail bits meets the criterion, then step 962 is performed. Otherwise, if the number of fail bits does not meet the criterion, then step 964 is performed.

In step 962, the gate voltage is outputted. In step 964, the gate voltage is adjusted. In one embodiment, if the number of fail bits is greater than the criterion, then the gate read voltage is increased (e.g., increased by a step size increment). In another embodiment, if the number of fail bits is less than the criterion, then the gate read voltage is decreased (e.g., decreased by step size increment). In step 966, the word line corresponding with the one or more memory cells is set to the adjusted gate voltage. After step 966 is performed, step 956 is performed.

Figure 9D:
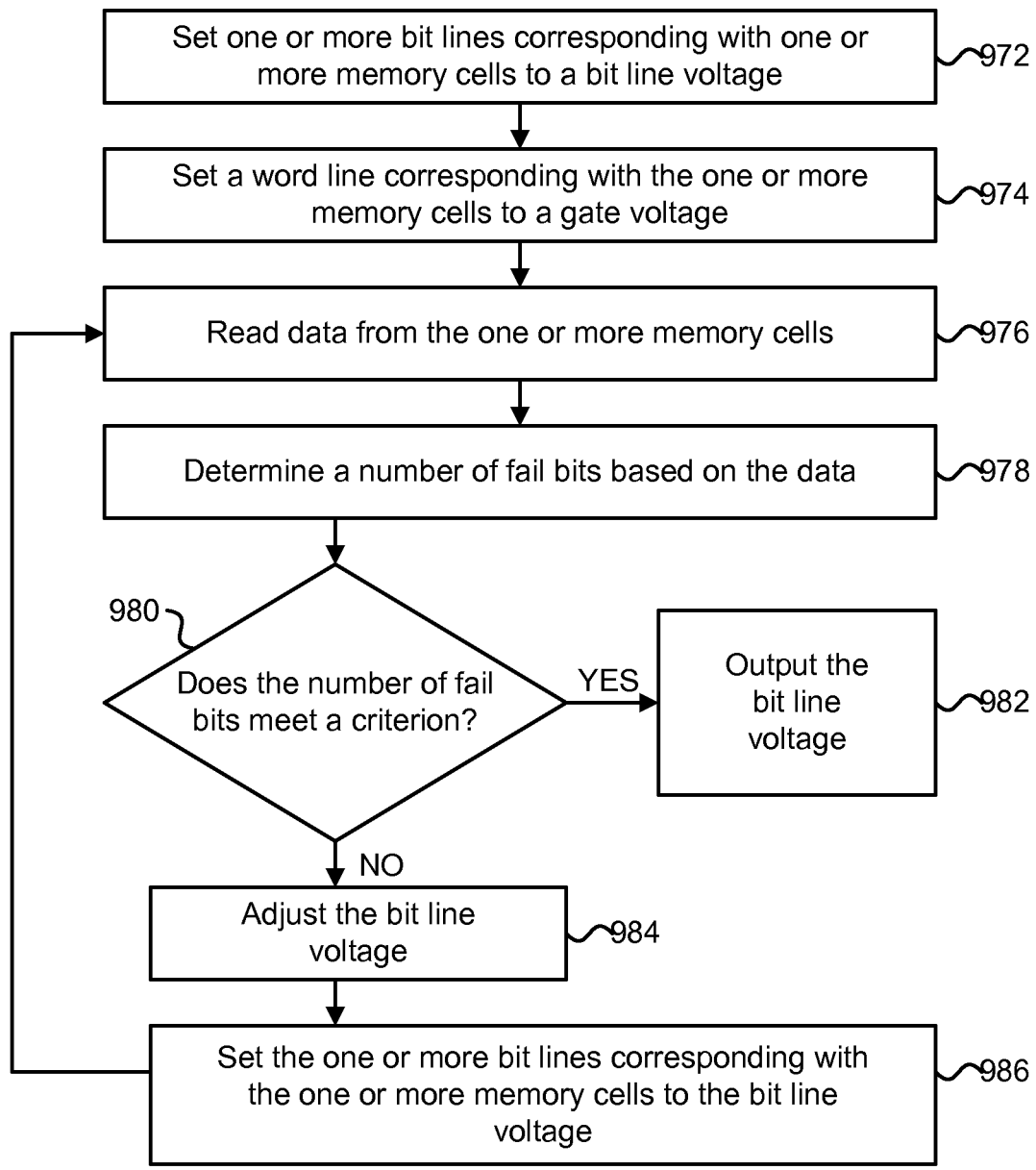
FIG. 9D is a flowchart describing one embodiment of a process for determining a bit line read voltage associated with a second set of memory cells.

FIG. 9D is a flowchart describing one embodiment of a process for determining a bit line read voltage associated with a second set of memory cells. The process described in FIG. 9D is one example of a process for implementing step 938 in FIG. 9B. In one embodiment, the process of FIG. 9D may be performed by a non-volatile storage system, such as non-volatile storage system 596 in FIG. 5.

In step 972, one or more bit lines corresponding with one or more memory cells are set to a bit line voltage. In step 974, a word line corresponding with the one or more memory cells is set to a gate voltage. In step 976, data is read from the one or more memory cells. In step 978, a number of fail bits is determined based on the data read from the one or more memory cells. In step 980, it is determined whether the number of fail bits meets a criterion. If the number of fail bits meets the criterion, then step 982 is performed. Otherwise, if the number of fail bits does not meet the criterion, then step 984 is performed.

In step 982, the bit line voltage is outputted. In step 984, the bit line voltage is adjusted. In one embodiment, if the number of fail bits is greater than the criterion, then the bit line voltage is increased (e.g., increased by a step size increment). In another embodiment, if the number of fail bits is less than the criterion, then the bit line voltage is decreased (e.g., decreased by step size increment). In step 986, the one or more bit lines corresponding with the one or more memory cells are set to the adjusted bit line voltage. After step 986 is performed, step 976 is performed.

Figure 10:
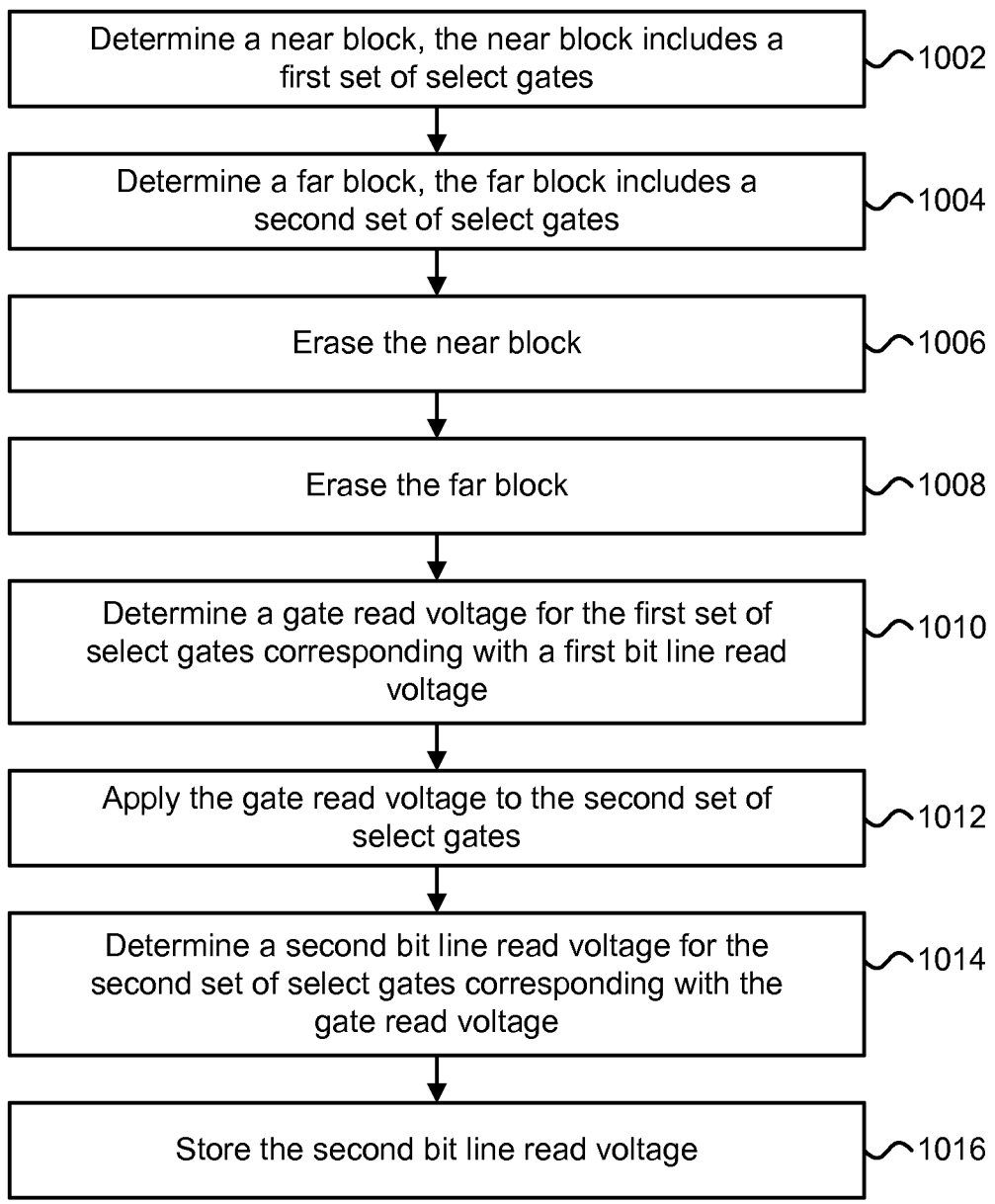
FIG. 10 is a flowchart describing an alternative embodiment of a process for determining a plurality of bit line read voltages associated with a plurality of zones.

FIG. 10 is a flowchart describing an alternative embodiment of a process for determining a plurality of bit line read voltages associated with a plurality of zones. The process described in FIG. 10 is one example of a process for implementing step 902 in FIG. 9A. In one embodiment, the process of FIG. 10 may be performed by a non-volatile storage system, such as non-volatile storage system 596 in FIG. 5.

In step 1002, a near block is determined. The near block may include a first set of select gates. In step 1004, a far block is determined. The far block may include a second set of select gates. In some cases, the near block may correspond with a top block in a memory plane and the far block may correspond with a bottom block in a memory plane. In step 1006, the near block is erased. In step 1008, the far block is erased.

In step 1010, a gate read voltage for the first set of select gates corresponding with a first bit line read voltage is determined. The first bit line read voltage may be associated with a target memory cell drain voltage. In one embodiment, a pass voltage is placed on all word lines in the near block such that the first set of select gates determine the amount of current flowing through the bit lines associated with the first set of select gates (i.e., the threshold voltages of the select gates may limit the current through the bit lines and not the threshold voltages of the memory cells).

In one embodiment, the near block is selected and the gate read voltage (e.g., biasing the gates of the first set of select gates) is swept until sensing criteria is satisfied. In one example, the sensing criteria may comprise a number of fail bits (e.g., 32, 128, 256, or 512 read bit failures) and/or other bit scan criteria. In this case, the number of fail bits does not relate to the conduction capability of memory cells, but instead is related to the amount of current that may be passed through the select gates. In another example, the sensing criteria may comprise a target source current, wherein the target source current may be measured by the current limited by the select gates and passing through the source line associated with a particular block. In one example, the target source current (Icelsrc) may be set between 10 mA and 50 mA. In one embodiment, the sensing criteria may require both a number of fail bits and a target source current to be satisfied.

In one embodiment, the gate read voltage may be determined by performing a sensing operation associated with the first set of select gates using an initial gate read voltage (sensing the amount of current that may be drawn by the select gates and not the memory cells), determining a number of fail bits associated with the sensing operation, determining whether the number of fail bits corresponds with a sensing criterion, and increasing (e.g., in step size increments) the gate read voltage if the number of fail bits is greater than the number of fail bits associated with the sensing criterion. In another embodiment, the gate read voltage may be determined by performing a sensing operation associated with the first set of select gates using an initial gate read voltage, determining a number of fail bits associated with the sensing operation, determining whether the number of fail bits is greater than the number of fail bits associated with a sensing criterion, and reducing the gate read voltage if the number of fail bits is less than the number of fail bits associated with the sensing criterion.

In one embodiment, the first set of select gates may correspond with a first grouping of bit lines. In one example, the first grouping of bit lines may be associated with a grouping of even bit lines (e.g., bit line 0, bit line 2, bit line 4, etc.). In another example, the first grouping of bit lines may be associated with a grouping of odd bit lines (e.g., bit line 1, bit line 3, bit line 5, etc.). In another example, the first grouping of bit lines may correspond with a grouping of every fourth bit line (e.g., bit line 0, bit line 4, bit line 8, bit line 12, etc.).

In step 1012, the gate read voltage is applied to the second set of select gates. In one embodiment, the gate read voltage may be applied to a select line common to the second set of select gates.

In step 1014, a second bit line read voltage is determined for the second set of select gates corresponding with the gate read voltage. The second bit line read voltage applied to the second set of select gates may be greater than the first bit line read voltage applied to the first set of select gates in order to compensate for increased IR voltage drops along bit lines connected to both the first set of select gates and the second set of select gates (e.g., a bit line may connect to a first select gate of the first set of select gates and a second select gate of the second set of select gates). In one embodiment, the second bit line read voltage may be determined by performing a sensing operation associated with the second set of select gates (sensing the amount of current that may be drawn by the select gates and not the memory cells), determining a number of fail bits associated with the sensing operation, determining whether the number of fail bits corresponds with a sensing criterion, and increasing the bit line read voltage if the number of fail bits is greater than the number of fail bits associated with the sensing criterion. In step 1016, the second bit line read voltage is stored (e.g., in a non-volatile memory).

In one embodiment, the second set of select gates may correspond with a second grouping of bit lines. In one example, the second grouping of bit lines may be associated with a grouping of even bit lines (e.g., bit line 0, bit line 2, bit line 4, etc.). In another example, the second grouping of bit lines may be associated with a grouping of odd bit lines (e.g., bit line 1, bit line 3, bit line 5, etc.). In another example, the second grouping of bit lines may correspond with a grouping of every fourth bit line (e.g., bit line 0, bit line 4, bit line 8, bit line 12, etc.).

In some embodiments, one or more bit line read voltages may be determined for each block in a memory plane (e.g., for all 32 blocks in a memory plane) or for a subset of the blocks in a memory plane (e.g., for 4 blocks out of 32 total blocks in a memory plane). In cases where a particular block in a memory plane (or zone) does not have corresponding bit line read voltages that have been predetermined, then interpolation techniques may be applied using other bit line read voltages associated with other blocks in the memory plane in order to determine an appropriate bit line read voltage for the particular block. In some cases, the interpolated bit line read voltages may be stored in a non-volatile memory.

In some embodiments, each of the one or more bit line read voltages associated with a particular block in a memory plane may correspond with different memory cell sensing currents. In one example, a far block may be associated with a first bit line read voltage corresponding with a sensing current of 100 nA and a second bit line read voltage corresponding with a sensing current of 500 nA.

Figure 11:
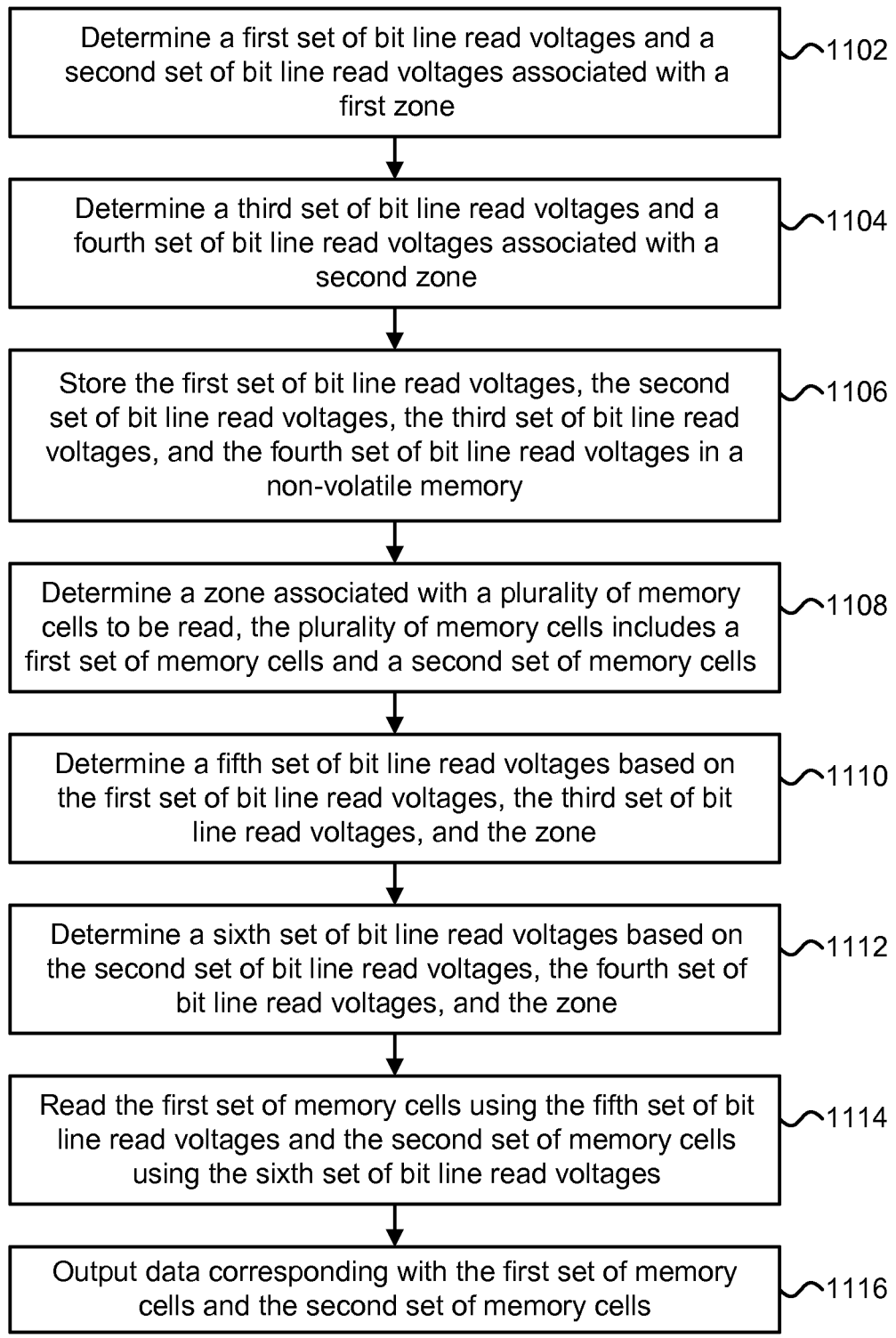
FIG. 11 is a flowchart describing one embodiment of a process for compensating for systematic variations in bit line resistance during sensing of memory cells.

FIG. 11 is a flowchart describing one embodiment of a process for compensating for systematic variations in bit line resistance during sensing of memory cells. In one embodiment, the process of FIG. 11 may be performed by a non-volatile storage system, such as non-volatile storage system 596 in FIG. 5.

In step 1102, a first set of bit line read voltages associated with a first zone and a second set of bit line read voltages associated with the first zone are determined. In step 1104, a third set of bit line read voltages associated with a second zone and a fourth set of bit line read voltages associated with the second zone are determined. In some embodiments, for each die or each memory plane (or memory core) on a die, the first set of bit line read voltages, the second set of bit line read voltages, the third set of bit line read voltages, and the fourth set of bit line read voltages may be determined based on sensing criteria. In one example, the sensing criteria may comprise a number of fail bits. In another example, the sensing criteria may comprise a particular memory cell source current. In one embodiment, the determination of the bit line read voltages associated with the first zone and the second zone may be performed by one or more managing circuits (e.g., by a combination of control circuitry 510, state machine 512, decoders 530/560, power control 516, and read/write circuits 565 in FIG. 5).

In one embodiment, the first set of bit line read voltages may correspond with a grouping of even bit lines within the first zone and the second set of bit line read voltages may correspond with a grouping of odd bit lines within the first zone. The third set of bit line read voltages may correspond with a grouping of even bit lines within the second zone and the fourth set of bit line read voltages may correspond with a grouping of odd bit lines within the second zone. In some cases, the first zone may correspond with a near zone within a memory plane (e.g., near the sense amplifiers) and the second zone may correspond with a far zone within the memory plane (e.g., far away from the sense amplifiers).

Various embodiments of processes for determining a plurality of bit line read voltages was described previously in reference to FIG. 9B and FIG. 10.

In step 1106, the first set of bit line read voltages, the second set of bit line read voltages, the third set of bit line read voltages, and the fourth set of bit line read voltages are stored in a non-volatile memory. The non-volatile memory may be located on the same memory die in which the first zone and the second zone are located. The non-volatile memory may comprise a configuration portion of a memory array or a dedicated configuration bit memory. The configuration portion of a memory array and/or the dedicated configuration bit memory may include significant bit redundancy in order to provide for robust non-volatile storage of the bit line read voltages or various parameters for determining the bit line read voltages.

In step 1108, a zone associated with a plurality of memory cells to be read is determined. The plurality of memory cells may include a first set of memory cells and a second set of memory cells. In some cases, the first set of memory cells may be in communication with a grouping of even bit lines and the second set of memory cells may be in communication with a grouping of odd bit lines. In one embodiment, the zone may be determined using a block address. In another embodiment, the zone may be determined using a range of row addresses and/or a range of column addresses. As the location of sense amplifiers associated with a memory plane may be split (e.g., half of the sense amplifiers are located at the top of a memory plane and the other half of the sense amplifiers are located at the bottom of the memory plane), column address information may be used to determine whether a sense amplifier is located at the top or bottom of the memory plane. If the layout of sense amplifiers associated with a memory plane is split, then sense amplifiers located near the top of the memory plane will be located farthest away from NAND strings located near the bottom of the memory plane and sense amplifiers located near the bottom of the memory plane will be located farthest away from NAND strings located near the top of the memory plane. In another embodiment, the zone may be determined using both block address information and column address information.

In step 1110, a fifth set of bit line read voltages is determined based on the first set of bit line read voltages, the third set of bit line read voltages, and the zone. In step 1112, a sixth set of bit line read voltages is determined based on the second set of bit line read voltages, the fourth set of bit line read voltages, and the zone. In one embodiment, the fifth set of bit line read voltages and the sixth set of bit line read voltages may be acquired from the non-volatile memory based on the zone (e.g., the zone comprises the first zone). In another embodiment, the fifth set of bit line read voltages and the sixth set of bit line read voltages may be interpolated. In one example, the fifth set of bit line read voltages may be determined via linear interpolation using the first set of bit line read voltages and the third set of bit line read voltages. The sixth set of bit line read voltages may be determined via linear interpolation using the second set of bit line read voltages and the fourth set of bit line read voltages. In some cases, the resistance of a bit line (and the voltage drop across portions of the bit line) may be directly proportional to the length of the bit line from a sense amplifier to the zone.

In step 1114, the first set of memory cells is read (or sensed) using the fifth set of bit line read voltages and the second set of memory cells is read (or sensed) using the sixth set of bit line read voltages. In one embodiment, the first set of memory cells and the second set of memory cells may be associated with a common word line and sensed concurrently. In some cases, the fifth set of bit line read voltages is applied to the first set of memory cells being sensed at the same time (or during the same time period) that the sixth set of bit line read voltages is applied to the second set of memory cells being sensed. In step 1116, data corresponding with the first set of memory cells and the second set of memory cells is outputted.

Figure 12A:
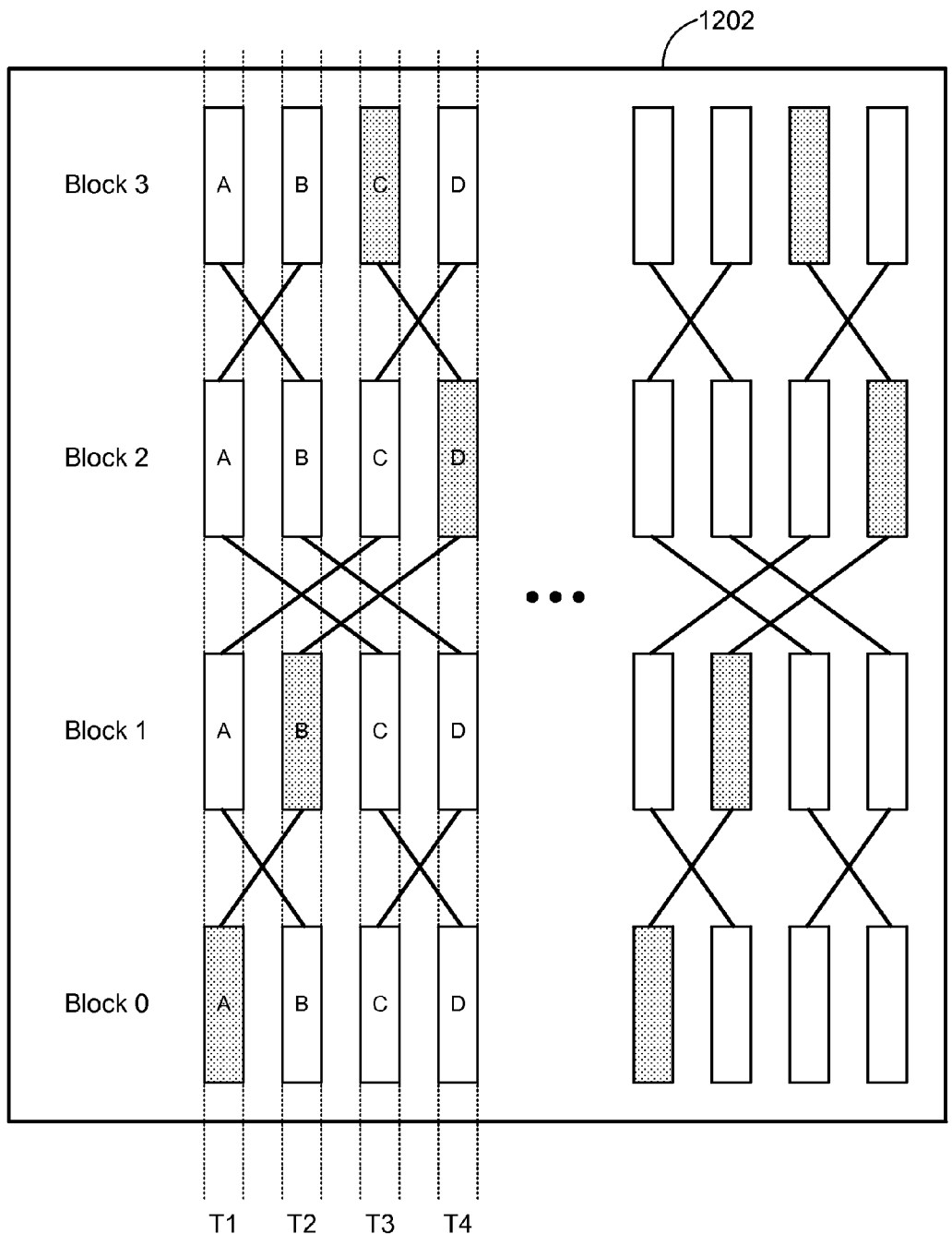
FIGS. 12A-12C depict various embodiments of bit line self-compensation techniques.
Figure 12B:
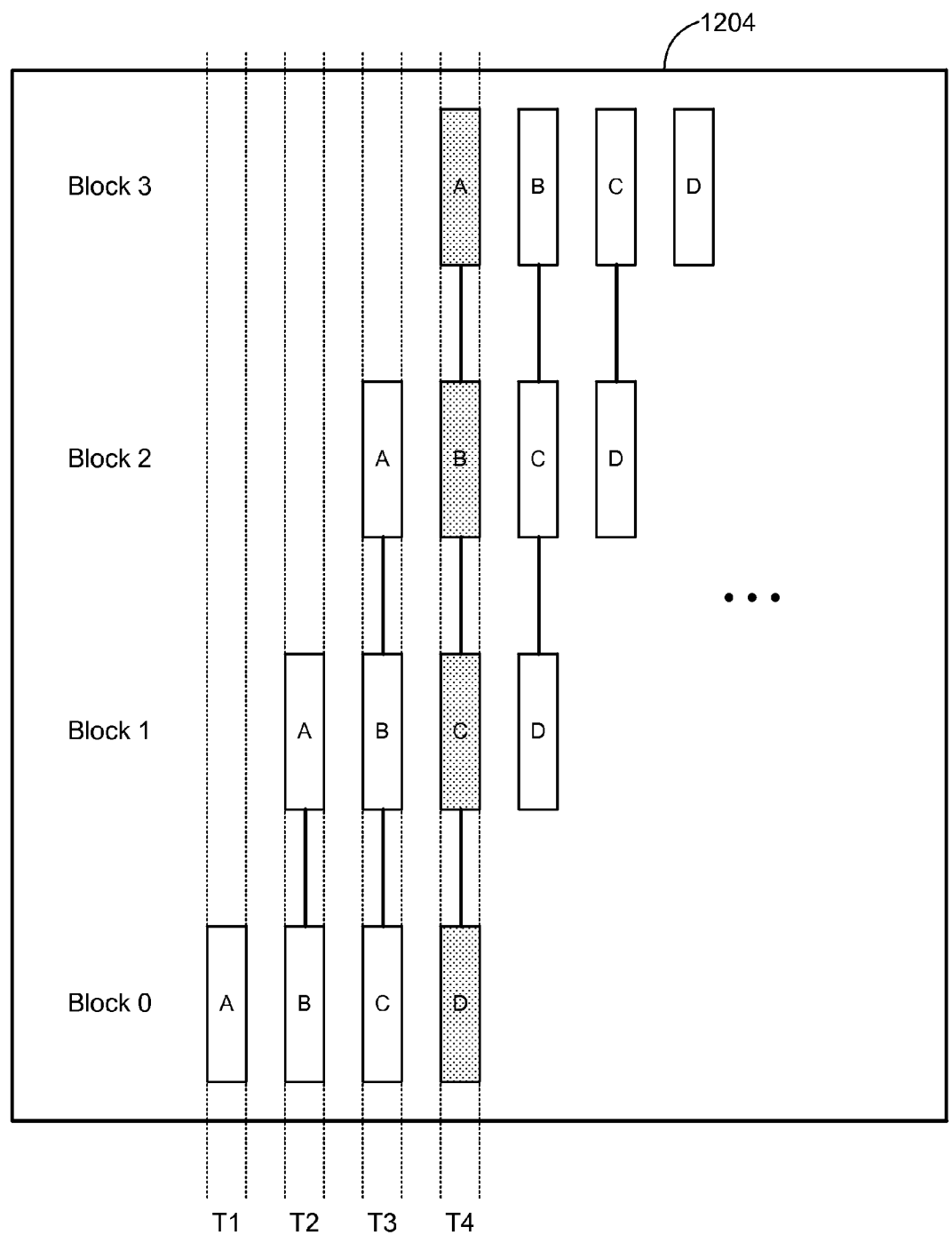
Figure 12C:
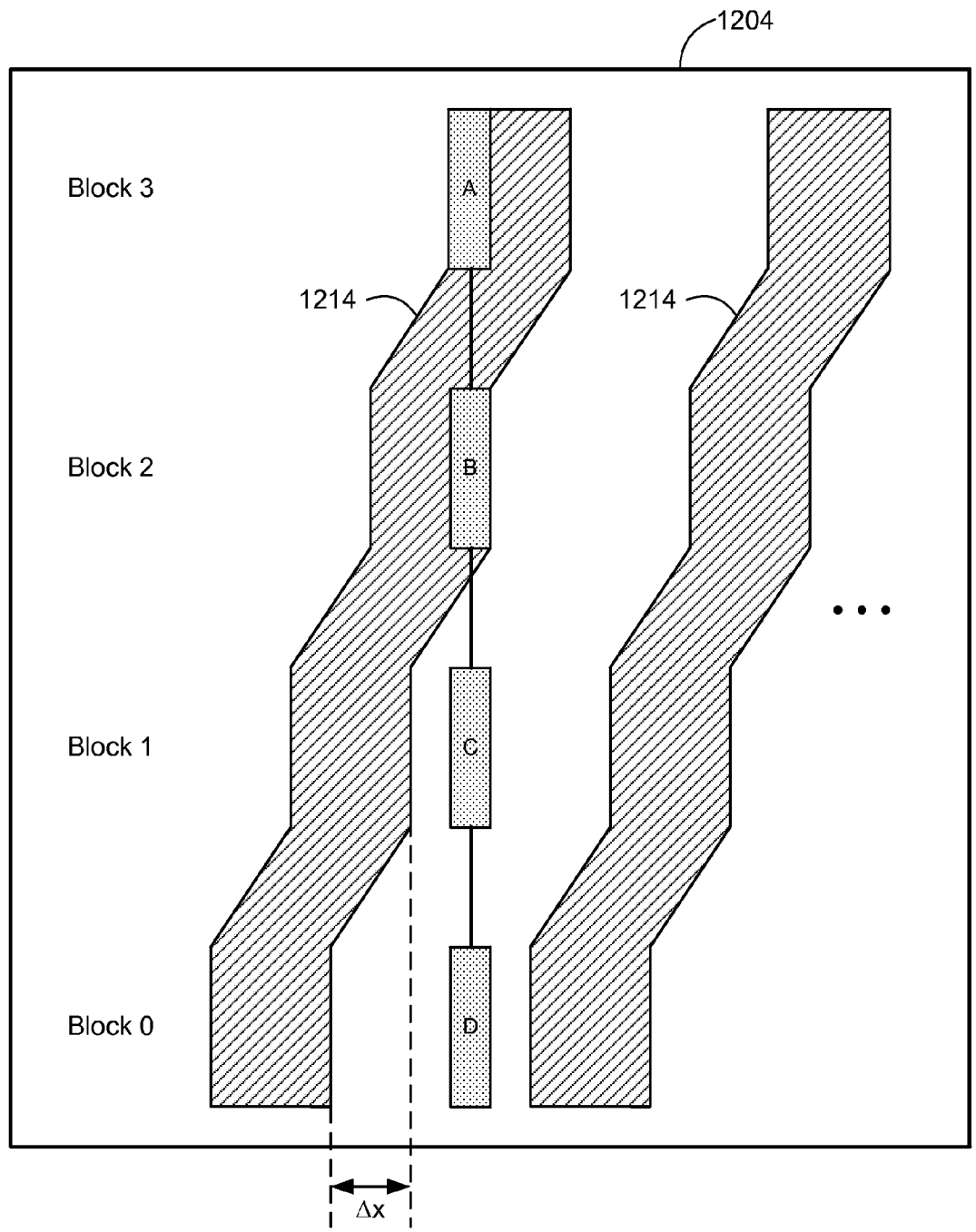

FIGS. 12A-12C depict various embodiments of bit line self-compensation techniques for mitigating variations in bit line resistance.

FIG. 12A depicts a memory array 1202, such as memory array 400 in FIG. 5 or memory array 200 in FIGS. 8A-8C. As depicted, memory array 1202 includes four blocks (blocks 0-3). It should be noted that the bit line self-compensation techniques described herein may be applied to memory arrays with more than or less than four blocks (e.g., memory arrays comprising 8 blocks, 16 blocks, 32 blocks, etc.). Each block includes a plurality of bit line segments associated with a plurality of tracks. The plurality of bit line segments may be grouped into groups of four adjacent bit line segments (e.g., bit line segment A assigned to track T1, bit line segment B assigned to track T2, bit line segment C assigned to track T3, and bit line segment D assigned to track T4 of block 0 may comprise a group of four adjacent bit line segments). As a double side-wall assisted process (DSAP) may be used to form the four adjacent bit line segments from a common core (or mandrel), systematic variations in one of the four adjacent bit line segments may be common to every group of four adjacent bit line segments within a block. As each of the four adjacent bit line segments may be associated with a different width (or resistance), bit line segment swapping may be used between blocks within a memory array to average out overall bit line resistance.

In one embodiment, in order to mitigate variations in bit line resistance corresponding with a group of four bit lines, a first bit line of the group of four bit lines may include a first bit line segment A assigned to track T1 in block 0 connected to a second bit line segment B assigned to track T2 in block 1 connected to a third bit line segment D assigned to track T4 in block 2 connected to a fourth bit line segment C assigned to track T3 in block 3. A second bit line of the group of four bit lines may include a first bit line segment B assigned to track T2 in block 0 connected to a second bit line segment A assigned to track T1 in block 1 connected to a third bit line segment C assigned to track T3 in block 2 connected to a fourth bit line segment D assigned to track T4 in block 3. As such, both the first bit line and the second bit line comprise four bit line segments from each of the four tracks. Thus, track dependent line resistance variations may be averaged in order to minimize the difference in bit line resistance between adjacent bit lines.

In some cases, rather than swapping bit line track assignments between blocks in a memory array, bit line track assignments may be swapped per zone (or grouping of one or more blocks). In one example, a memory array may include eight blocks and the bit line track assignment swapping may be performed every two blocks such that each of four bit lines may comprise four bit line segments from each of four different tracks, wherein each bit line segment covers two blocks.

In some embodiments, a memory array may include more than four blocks (or zones) in which the bit line swapping techniques to minimize the difference in bit line resistance between adjacent bit lines may be applied among every four blocks (or zones) and repeated for every grouping of four blocks (or zones). In one example, a memory array may include eight blocks (e.g., blocks 0-7) with a first grouping of four blocks (e.g., blocks 0-3) swapping bit line track assignments using the local routing for connecting bit line segments into bit lines depicted in FIG. 12A and a second grouping of four blocks (e.g., blocks 4-7) repeating the same swapping of bit line track assignments as depicted in FIG. 12A (e.g., a fourth bit line segment C assigned to track T3 in block 3 may be connected to a fifth bit line segment A assigned to track T1 in block 4).

FIG. 12B depicts a memory array 1204, such as memory array 400 in FIG. 5 or memory array 200 in FIGS. 8A-8C. As depicted, memory array 1204 includes four blocks (blocks 0-3). It should be noted that the bit line self-compensation techniques described herein may be applied to memory arrays with more than or less than four blocks (e.g., memory arrays comprising 8 blocks, 16 blocks, 32 blocks, etc.). Each block includes a plurality of bit line segments associated with a plurality of tracks.

As depicted, each group of four adjacent bit line segments may be offset (or staggered) per block such that the local routing necessary to connect bit line segments into bit lines may be simplified (e.g., a straight connection may be used connect the bit line segments together to form a portion of a bit line). In one embodiment, a first bit line may include a first bit line segment D assigned to track T4 in block 0 connected to a second bit line segment C assigned to track T4 in block 1 connected to a third bit line segment B assigned to track T4 in block 2 connected to a fourth bit line segment A assigned to track T4 in block 3. In some embodiments, each group of adjacent bit line segments may be offset by one bit line pitch. In some cases, the connections from a first bit line segment in a first block to a second bit line segment in a second block may be made using local routing layers. The connections from a first bit line segment in a first block to a second bit line segment in a second block may be made using one or more routing layers different from the routing layer used for the first bit line segment and the second bit line segment.

FIG. 12C depicts one embodiment of a core mask for creating a plurality of bit lines associated with memory array 1204. As depicted, the core mask includes two staggered core lines 1214. Each of the two staggered core lines 1214 may be used to form a plurality of bit lines (or bit line segments) using multiple patterning lithography. In one embodiment, the offset (Δx) of each of the two staggered core lines 1214 between blocks is one bit line pitch.

One embodiment of the disclosed technology includes determining a gate read voltage for a first set of memory cells corresponding with a first bit line read voltage being applied to the first set of memory cells. The first set of memory cells is associated with a first zone of a memory plane. The method further comprises determining a second bit line read voltage for a second set of memory cells corresponding with the gate read voltage being applied to the second set of memory cells. The second set of memory cells is associated with a second zone of the memory plane. The method further comprises performing a sensing operation on one or more memory cells within the memory plane. The performing a sensing operation includes determining a bit line read voltage based on the second bit line read voltage and applying the bit line read voltage to one or more bit lines associated with the one or more memory cells during sensing of the one or more memory cells. The method further comprises outputting data stored in the one or more memory cells based on the performing a sensing operation.

One embodiment of the disclosed technology includes determining a first block within a memory plane and a second block within the memory plane. The first block includes a first set of memory cells. The second block includes a second set of memory cells. The method further comprises determining a gate read voltage for the first set of memory cells corresponding with a first bit line read voltage being applied to the first set of memory cells, determining a second bit line read voltage for the second set of memory cells corresponding with the gate read voltage being applied to the second set of memory cells, storing the second bit line read voltage in a non-volatile memory, and performing a read operation on one or more memory cells within the memory plane. The read operation includes acquiring the second bit line read voltage from the non-volatile memory and determining a bit line read voltage based on the second bit line read voltage. The read operation includes applying the bit line read voltage to one or more bit lines associated with the one or more memory cells during sensing of the one or more memory cells. The method further comprises outputting data stored in the one or more memory cells based on the performing a read operation.

One embodiment of the disclosed technology includes a non-volatile storage system including a semiconductor memory array and one or more managing circuits in communication with the semiconductor memory array. The semiconductor memory array includes a first set of memory cells associated with a first block of the semiconductor memory array and a second set of memory cells associated with a second block of the semiconductor memory array. The one or more managing circuits determine a gate read voltage for the first set of memory cells based on a sensing criterion being satisfied when the gate read voltage and a first bit line read voltage are applied to the first set of memory cells. The one or more managing circuits determine a second bit line read voltage for the second set of memory cells based on the sensing criterion being satisfied when the gate read voltage and the second bit line read voltage are applied to the second set of memory cells. The second bit line read voltage is greater than the first bit line read voltage. The one or more managing circuits perform a sensing operation on one or more memory cells within the semiconductor memory array. The sensing operation includes determining a bit line read voltage based on the second bit line read voltage and applying the bit line read voltage to one or more bit lines associated with the one or more memory cells during the sensing operation.

One embodiment of the disclosed technology includes determining a gate read voltage for a first set of transistors corresponding with a first bit line read voltage being applied to the first set of transistors and determining a second bit line read voltage for a second set of transistors corresponding with the gate read voltage being applied to the second set of transistors. The first set of transistors is associated with a first zone of a memory plane. The second set of transistors is associated with a second zone of the memory plane. The method further comprises performing a sensing operation on one or more memory cells within the memory plane including determining a bit line read voltage based on the second bit line read voltage and applying the bit line read voltage to one or more bit lines associated with the one or more memory cells during sensing of the one or more memory cells.

One embodiment of the disclosed technology includes determining a first block within a memory plane and determining a second block within the memory plane. The first block includes a first set of transistors and the second block includes a second set of transistors. The method further includes determining a gate read voltage for the first set of transistors corresponding with a first bit line read voltage being applied to the first set of transistors, determining a second bit line read voltage for the second set of transistors corresponding with the gate read voltage being applied to the second set of transistors, storing the second bit line read voltage in a non-volatile memory, and performing a read operation on one or more memory cells within the memory plane. The performing a read operation includes acquiring the second bit line read voltage from the non-volatile memory and determining a bit line read voltage based on the second bit line read voltage. The performing a read operation includes applying the bit line read voltage to one or more bit lines associated with the one or more memory cells during sensing of the one or more memory cells. The method further comprises outputting data stored in the one or more memory cells based on the performing a read operation.

One embodiment of the disclosed technology includes determining a first set of bit line read voltages associated with a zone within a memory plane and determining a second set of bit line read voltages associated with the zone within the memory plane. The first set of bit line read voltages is different from the second set of bit line read voltages. The method further includes performing a sensing operation on a first set of memory cells and a second set of memory cells within the zone. The performing a sensing operation includes applying the first set of bit line read voltages to the first set of memory cells and applying the second set of bit line read voltages to the second set of memory cells. The method further includes outputting data stored in the first set of memory cells and the second set of memory cells based on the performing a sensing operation.

One embodiment of the disclosed technology includes a semiconductor memory array and one or more managing circuits in communication with the semiconductor memory array. The semiconductor memory array includes a first set of memory cells associated with a first block of the semiconductor memory array and a second set of memory cells associated with the first block of the semiconductor memory array. The one or more managing circuits determine a first set of bit line read voltages associated with the first block and determine a second set of bit line read voltages associated with the first block different from the first set of bit line read voltages. The one or more managing circuits perform a concurrent sensing operation on a first set of memory cells and a second set of memory cells within the first block. The concurrent sensing operation includes concurrently applying the first set of bit line read voltages to the first set of memory cells and applying the second set of bit line read voltages to the second set of memory cells.

One embodiment of the disclosed technology includes determining a first set of bit line read voltages and a second set of bit line read voltages associated with a first zone; determining a third set of bit line read voltages and a fourth set of bit line read voltages associated with a second zone; storing the first set of bit line read voltages, the second set of bit line read voltages, the third set of bit line read voltages, and the fourth set of bit line read voltages in a non-volatile memory; determining a zone associated with a plurality of memory cells to be sensed, the plurality of memory cells includes a first set of memory cells and a second set of memory cells; determining a fifth set of bit line read voltages based on the first set of bit line read voltages, the third set of bit line read voltages, and the zone; determining a sixth set of bit line read voltages based on the second set of bit line read voltages, the fourth set of bit line read voltages, and the zone; concurrently sensing the first set of memory cells using the fifth set of bit line read voltages and the second set of memory cells using the sixth set of bit line read voltages; and outputting data corresponding with the first set of memory cells and the second set of memory cells.

One embodiment of the disclosed technology includes a first plurality of bit line segments associated with a first zone of a memory array, a second plurality of bit line segments associated with a second zone of the memory array, and a bit line. The first plurality of bit line segments includes a first segment derived from a first spacer. The second plurality of bit line segments includes a second segment derived from a second spacer different from the first spacer. The bit line includes the first segment and the second segment.

One embodiment of the disclosed technology includes determining a first set of bit line read voltages and performing a sensing operation on a first set of memory cells within a memory array. The performing a sensing operation includes applying the first set of bit line read voltages to the first set of memory cells. The memory array includes a first zone and a second zone. The first zone includes a first plurality of bit line segments. The first plurality of bit line segments includes a first segment derived from a first spacer. The second zone includes a second plurality of bit line segments. The second plurality of bit line segments includes a second segment derived from a second spacer different from the first spacer. The memory array includes a bit line including the first segment and the second segment. The applying the first set of bit line read voltages includes applying a bit line read voltage of the first set of bit line read voltages to the bit line. The method further includes outputting data stored in the first set of memory cells based on the performing a sensing operation.

One embodiment of the disclosed technology includes a first block of a memory array including a first set of bit line segments associated with a plurality of tracks, a second block of the memory array including a second set of bit line segments associated with the plurality of tracks, a third block of the memory array including a third set of bit line segments associated with the plurality of tracks, and a bit line. The bit line includes a first segment of the first set of bit line segments associated with a first track of the plurality of tracks, a second segment of the second set of bit line segments associated with a second track of the plurality of tracks different from the first track, and a third segment of the third set of bit line segments associated with a third track of the plurality of tracks different from the first track and the second track.

Various features and techniques have been presented with respect to the NAND flash memory architecture. It will be appreciated from the provided disclosure that implementations of the disclosed technology are not so limited. By way of non-limiting example, embodiments in accordance with the present disclosure may be used in a wide range of semiconductor devices, including but not limited to volatile memories including SRAM and DRAM, and non-volatile memories including NOR flash memory and NAND flash memory.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for compensating for variability in bit line resistance, comprising:
   determining a gate read voltage for a first set of transistors corresponding with a first bit line read voltage being applied to the first set of transistors, the first set of transistors is associated with a first zone of a memory plane;
   determining a second bit line read voltage for a second set of transistors corresponding with the gate read voltage being applied to the second set of transistors, the second set of transistors is associated with a second zone of the memory plane;
   performing a sensing operation on one or more memory cells within the memory plane, the performing a sensing operation includes determining a bit line read voltage based on the second bit line read voltage and applying the bit line read voltage to one or more bit lines associated with the one or more memory cells during sensing of the one or more memory cells; and
   outputting data stored in the one or more memory cells based on the performing a sensing operation.

2. The method of claim 1, wherein:
   the first set of transistors includes a first set of select gate transistors associated with the first zone of the memory plane; and
   the second set of transistors includes a second set of select gate transistors associated with the second zone of the memory plane.

3. The method of claim 1, wherein:
   the first set of transistors includes a first set of memory cells associated with the first zone of the memory plane; and
   the second set of transistors includes a second set of memory cells associated with the second zone of the memory plane.

4. The method of claim 1, wherein:
   the determining a gate read voltage includes determining whether the first set of transistors satisfies a sensing criterion; and the determining a second bit line read voltage includes determining whether the second set of transistors satisfies the sensing criterion.

5. The method of claim 4, wherein:
the sensing criterion comprises a number of fail bits.

6. The method of claim 4, wherein:
the sensing criterion comprises a target source current.

7. The method of claim 1, wherein:
the one or more memory cells are located within a third zone of the memory plane; and
the bit line read voltage corresponds with an interpolated voltage based on at least the second bit line read voltage.

8. The method of claim 1, wherein:
the one or more memory cells are located within a third zone of the memory plane between the first zone and the second zone; and
the bit line read voltage corresponds with an interpolated voltage based on the first bit line read voltage, the second bit line read voltage, and the location of the third zone relative to the first zone and the second zone.

9. The method of claim 1, wherein:
the one or more memory cells are located within the second zone; and
the bit line read voltage corresponds with the second bit line read voltage.

10. The method of claim 3, further comprising:
programming the first set of memory cells to an initial voltage prior to the determining a gate read voltage; and
programming the second set of memory cells to the initial voltage prior to the determining a second bit line read voltage.

11. The method of claim 3, further comprising:
erasing the first set of memory cells prior to the determining a gate read voltage;
programming the first set of memory cells to an initial voltage without performing a read verify prior to the determining a gate read voltage;
erasing the second set of memory cells prior to the determining a second bit line read voltage; and
programming the second set of memory cells to the initial voltage without performing a read verify prior to the determining a second bit line read voltage.

12. The method of claim 1, wherein:
the first zone is associated with a near block;
the second zone is associated with a far block;
the second bit line read voltage is greater than the first bit line read voltage; and
each of the one or more memory cells is associated with a different NAND string.

13. A non-volatile storage system, comprising:
a semiconductor memory array, the semiconductor memory array includes a first set of memory cells associated with a first block of the semiconductor memory array and a second set of memory cells associated with a second block of the semiconductor memory array; and
one or more managing circuits in communication with the semiconductor memory array, the one or more managing circuits determine a gate read voltage for the first set of memory cells based on a sensing criterion being satisfied when the gate read voltage and a first bit line read voltage are applied to the first set of memory cells, the one or more managing circuits determine a second bit line read voltage for the second set of memory cells based on the sensing criterion being satisfied when the gate read voltage and the second bit line read voltage are applied to the second set of memory cells, the second bit line read voltage is greater than the first bit line read voltage, the one or more managing circuits perform a sensing operation on one or more memory cells within the semiconductor memory array, the sensing operation includes determining a bit line read voltage based on the second bit line read voltage and applying the bit line read voltage to one or more bit lines associated with the one or more memory cells during the sensing operation.

14. The non-volatile storage system of claim 13, wherein:
the sensing criterion includes a number of fail bits.

15. The non-volatile storage system of claim 13, wherein:
the sensing criterion comprises a target source current.

16. The non-volatile storage system of claim 13, wherein:
the one or more memory cells are associated with a third block of the semiconductor memory array; and
the bit line read voltage corresponds with an interpolated voltage based on at least the second bit line read voltage.

17. The non-volatile storage system of claim 13, wherein:
the one or more memory cells are associated with a third block of the semiconductor memory array located between the first block and the second block; and
the bit line read voltage corresponds with an interpolated voltage based on the first bit line read voltage, the second bit line read voltage, and the location of the third block relative to the first block and the second block.

18. The non-volatile storage system of claim 13, wherein:
the first block comprises a near block;
the second block comprises a far block; and
the one or more memory cells are associated with one or more NAND strings.

19. A method for compensating for variability in bit line resistance, comprising:
determining a first block within a memory plane, the first block includes a first set of transistors;
determining a second block within the memory plane, the second block includes a second set of transistors;
determining a gate read voltage for the first set of transistors corresponding with a first bit line read voltage being applied to the first set of transistors;
determining a second bit line read voltage for the second set of transistors corresponding with the gate read voltage being applied to the second set of transistors;
storing the second bit line read voltage in a non-volatile memory;
performing a read operation on one or more memory cells within the memory plane, the performing a read operation includes acquiring the second bit line read voltage from the non-volatile memory and determining a bit line read voltage based on the second bit line read voltage, the performing a read operation includes applying the bit line read voltage to one or more bit lines associated with the one or more memory cells during sensing of the one or more memory cells; and
outputting data stored in the one or more memory cells based on the performing a read operation.

20. The method of claim 19, wherein:
the first set of transistors comprises a first set of memory cells; and
the second set of transistors comprises a second set of memory cells.

21. The method of claim 20, wherein:
the determining a gate read voltage includes determining whether the first set of memory cells satisfies a sensing criterion; and
the determining a second bit line read voltage includes determining whether the second set of memory cells satisfies the sensing criterion.

22. The method of claim 21, wherein:
the sensing criterion comprises a number of fail bits.

23. The method of claim 19, wherein:
the one or more memory cells are located within a third block of the memory plane; and
the bit line read voltage corresponds with an interpolated voltage based on at least the second bit line read voltage.

24. The method of claim 19, wherein:
the one or more memory cells are located within a third block of the memory plane between the first block and the second block; and
the bit line read voltage corresponds with an interpolated voltage based on the first bit line read voltage, the second bit line read voltage, and the location of the third block relative to the first block and the second block.

25. The method of claim 19, wherein:
the one or more memory cells are located within the second block; and
the bit line read voltage corresponds with the second bit line read voltage.

26. The method of claim 20, further comprising:
programming the first set of memory cells to an initial voltage prior to the determining a gate read voltage; and
programming the second set of memory cells to the initial voltage prior to the determining a second bit line read voltage.

27. The method of claim 20, further comprising:
erasing the first block prior to the determining a gate read voltage;
programming the first set of memory cells to an initial voltage without performing a read verify prior to the determining a gate read voltage;
erasing the second block prior to the determining a second bit line read voltage; and
programming the second set of memory cells to the initial voltage without performing a read verify prior to the determining a second bit line read voltage.

28. The method of claim 19, wherein:
the first block comprises a near block;
the second block comprises a far block;
the second bit line read voltage is greater than the first bit line read voltage; and
each of the one or more memory cells is associated with a different NAND string within the memory plane.

* * * * *